United States Patent
Senoo

(10) Patent No.: US 8,476,732 B2
(45) Date of Patent: Jul. 2, 2013

(54) SEMICONDUCTOR DEVICE

(75) Inventor: Masaru Senoo, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 329 days.

(21) Appl. No.: 12/995,855

(22) PCT Filed: Dec. 10, 2008

(86) PCT No.: PCT/JP2008/072431
§ 371 (c)(1),
(2), (4) Date: Dec. 2, 2010

(87) PCT Pub. No.: WO2010/067430
PCT Pub. Date: Jun. 17, 2010

(65) Prior Publication Data
US 2011/0079870 A1    Apr. 7, 2011

(51) Int. Cl.
*H01L 21/00* (2006.01)
(52) U.S. Cl.
USPC ............................ 257/488; 257/504; 257/139
(58) Field of Classification Search
USPC .......................................... 257/504, 488, 139
See application file for complete search history.

(56) References Cited

U.S. PATENT DOCUMENTS

| | | | | | |
|---|---|---|---|---|---|
| 5,324,971 | A | * | 6/1994 | Notley | 257/328 |
| 5,731,627 | A | * | 3/1998 | Seok | 257/630 |
| 6,054,752 | A | * | 4/2000 | Hara et al. | 257/629 |
| 6,190,948 | B1 | * | 2/2001 | Seok | 438/140 |
| 6,307,232 | B1 | * | 10/2001 | Akiyama et al. | 257/347 |
| 6,809,349 | B2 | * | 10/2004 | Yamaguchi et al. | 257/133 |
| 6,888,206 | B2 | * | 5/2005 | Takahashi et al. | 257/407 |
| 6,909,142 | B2 | * | 6/2005 | Takahashi et al. | 257/330 |
| 7,078,740 | B2 | * | 7/2006 | Yamaguchi et al. | 257/133 |
| 7,088,489 | B2 | * | 8/2006 | Kiehne et al. | 359/254 |

(Continued)

FOREIGN PATENT DOCUMENTS

| | | |
|---|---|---|
| JP | 9-246552 A1 | 9/1997 |
| JP | 10-341018 A | 12/1998 |

(Continued)

OTHER PUBLICATIONS

Written Opinion and English translation thereof of PCT/JP2008/072431.

(Continued)

*Primary Examiner* — Laura Menz
(74) *Attorney, Agent, or Firm* — Kenyon & Kenyon LLP

(57) ABSTRACT

This specification discloses a semiconductor device having higher electric strength.
The semiconductor device disclosed in this specification has a semiconductor element region, a peripheral termination region, a peripheral electrode, an insulating film, and an intermediate electrode. A semiconductor element is formed within the semiconductor element region. The peripheral termination region is formed around the semiconductor element region and formed of a single conductive type semiconductor. The semiconductor element region and the peripheral termination region are exposed at one surface of a semiconductor substrate. The peripheral electrode is formed on a surface of the peripheral termination region and along a circumference of the semiconductor substrate. The insulating film is formed on the surface of the peripheral termination region and between the semiconductor element region and the peripheral electrode. The intermediate electrode is formed on the insulating film. A thickness of the insulating film under the intermediate electrode is larger at a side of the peripheral electrode than at a side of the semiconductor element region.

4 Claims, 16 Drawing Sheets

U.S. PATENT DOCUMENTS

| | | | |
|---|---|---|---|
| 7,122,875 B2 * | 10/2006 | Hatade | 257/488 |
| 7,170,106 B2 * | 1/2007 | Yamaguchi et al. | 257/133 |
| 7,189,620 B2 * | 3/2007 | Takahashi et al. | 438/268 |
| 7,319,257 B2 * | 1/2008 | Yamaguchi et al. | 257/331 |
| 7,582,918 B2 * | 9/2009 | Takahashi | 257/127 |
| 7,642,597 B2 * | 1/2010 | Saito | 257/341 |
| 7,872,282 B2 * | 1/2011 | Iwamoto et al. | 257/139 |
| 7,919,824 B2 * | 4/2011 | Ono et al. | 257/401 |
| 8,076,749 B2 * | 12/2011 | Kitagawa | 257/488 |
| 8,148,783 B2 * | 4/2012 | Nakagawa | 257/367 |
| 8,178,941 B2 * | 5/2012 | Kawano et al. | 257/494 |
| 8,242,535 B2 * | 8/2012 | Senoo | 257/139 |
| 8,299,523 B2 * | 10/2012 | Tomita et al. | 257/330 |
| 2003/0160262 A1 * | 8/2003 | Kitada et al. | 257/127 |
| 2003/0218220 A1 * | 11/2003 | Takahashi et al. | 257/409 |
| 2004/0066549 A1 * | 4/2004 | Kiehne et al. | 359/254 |
| 2004/0084722 A1 * | 5/2004 | Yamaguchi et al. | 257/330 |
| 2004/0207009 A1 * | 10/2004 | Yamaguchi et al. | 257/329 |
| 2005/0133857 A1 * | 6/2005 | Mauder et al. | 257/327 |
| 2005/0161761 A1 * | 7/2005 | Hatade | 257/487 |
| 2005/0167694 A1 * | 8/2005 | Takahashi | 257/127 |
| 2005/0233542 A1 * | 10/2005 | Takahashi et al. | 438/433 |
| 2006/0006409 A1 * | 1/2006 | Yamaguchi et al. | 257/133 |
| 2006/0131685 A1 * | 6/2006 | Watanabe et al. | 257/483 |
| 2006/0255407 A1 * | 11/2006 | Ishida | 257/347 |
| 2007/0114570 A1 * | 5/2007 | Yamaguchi et al. | 257/197 |
| 2008/0017897 A1 * | 1/2008 | Saito et al. | 257/288 |
| 2008/0135930 A1 * | 6/2008 | Saito | 257/330 |
| 2008/0179671 A1 * | 7/2008 | Saito et al. | 257/341 |
| 2008/0315343 A1 * | 12/2008 | Kitagawa | 257/488 |
| 2009/0194786 A1 * | 8/2009 | Iwamoto et al. | 257/139 |
| 2009/0236697 A1 * | 9/2009 | Ono et al. | 257/618 |
| 2010/0019342 A1 * | 1/2010 | Kawano et al. | 257/494 |
| 2010/0163987 A1 * | 7/2010 | Nakagawa | 257/341 |
| 2010/0258943 A1 * | 10/2010 | Senoo | 257/773 |
| 2010/0264489 A1 * | 10/2010 | Ohta et al. | 257/334 |
| 2011/0006338 A1 * | 1/2011 | Senoo | 257/139 |
| 2011/0073903 A1 * | 3/2011 | Yoshikawa et al. | 257/139 |
| 2011/0079870 A1 * | 4/2011 | Senoo | 257/504 |
| 2011/0204469 A1 * | 8/2011 | Onishi | 257/490 |
| 2011/0233714 A1 * | 9/2011 | Lu | 257/493 |
| 2012/0043638 A1 * | 2/2012 | Kitagawa | 257/488 |
| 2012/0193749 A1 * | 8/2012 | Kawano et al. | 257/488 |
| 2012/0241858 A1 * | 9/2012 | Komatsu et al. | 257/335 |
| 2012/0292662 A1 * | 11/2012 | Matsuura et al. | 257/139 |

FOREIGN PATENT DOCUMENTS

| | | |
|---|---|---|
| JP | 2002-231944 A | 8/2002 |
| JP | 2003-133555 A | 5/2003 |
| JP | 2005-209983 A | 8/2005 |
| JP | 2005-217152 A | 8/2005 |
| JP | 2006-080368 A | 3/2006 |
| JP | 2006-173437 A | 6/2006 |
| JP | 2007-157799 A | 6/2007 |
| JP | 2007-207784 A | 8/2007 |
| JP | 2008-187125 A | 8/2008 |
| WO | WO 2010067430 A1 * | 6/2010 |

OTHER PUBLICATIONS

International Search Report of PCT/JP2008/072431 and English translation thereof; Written Opinion of ISA of PCT/JP2008/072431 with English translation thereof (translation to follow).

European Search Report mailed Jan. 21, 2013 for EP Application No. 08878729.6.

* cited by examiner

SEMICONDUCTOR DEVICE

This is a 371 national phase application of PCT/JP2008/072431 filed 10 Dec. 2008, the content of which is incorporated herein by reference.

TECHNICAL FIELD

The present invention relates to a semiconductor device. Especially, the present invention relates to a semiconductor device in which a termination structure is formed between a circumference of a semiconductor substrate and a semiconductor element region.

BACKGROUND ART

In Japanese Published Patent Application No. 2003-133555, a semiconductor device in which a peripheral electrode is formed along a circumference of an upper surface of a semiconductor substrate is disclosed. The peripheral electrode is electrically connected with a semiconductor layer. Because the peripheral electrode is formed, when the semiconductor device is not conducting, a depleted layer extending from a semiconductor element region (the semiconductor element region is a region in which a semiconductor element is formed) is terminated in the semiconductor layer under the peripheral electrode. Therefore, the depleted layer is prevented from reaching the circumference of the semiconductor substrate. As a result, electric field is prevented from being applied to the circumference of the semiconductor substrate. On the other hand, if the peripheral electrode is formed, the depleted layer ends in the semiconductor layer under the peripheral electrode and the electric field is concentrated into that semiconductor layer. Therefore, an electric strength of the semiconductor device can not be increased so much merely by the peripheral electrode.

As a technique for solving the above problem, a semiconductor device having one or more intermediate electrodes, which are formed on the surface of the semiconductor substrate between the semiconductor element region and the peripheral electrode, is known (for example, Japanese Published Patent Application No. 2005-209983). The intermediate electrode is insulated from the semiconductor element region and the peripheral electrode. Furthermore, the intermediate electrode is formed on an insulating film and insulated from the semiconductor layer. That is, the intermediate electrode is in a floating state. Therefore, the intermediate electrode has an electric potential between an electric potential of the semiconductor element region and an electric potential of the peripheral electrode. If the intermediate electrode is formed, an electric potential of the semiconductor layer below the intermediate electrode corresponds to the electric potential of the intermediate electrode. Therefore, extension of the depleted layer from the semiconductor element region toward a side of the circumference is suppressed at the semiconductor layer below the intermediate electrode. That is, both of the intermediate electrode and the peripheral electrode suppress the extension of the depleted layer. As just described, in this semiconductor device, because the extension of the depleted layer is suppressed at the two points, the concentration of the electric field does not easy occur compared with the semiconductor device not having the intermediate electrode. By forming the intermediate electrode, the electric strength of the semiconductor device can be improved.

DISCLOSURE OF THE INVENTION

Technical Problem

Generally, the surface of the semiconductor substrate of the semiconductor device is covered with an insulating film. When using this semiconductor device, the insulating film may be charged. If the insulating film is charged, the electric potential of the semiconductor layer near the insulating film becomes substantially uniform. Therefore, it is easier for the depleted layer to extend along the surface of the semiconductor substrate. If the insulating film, which is included in the above-described semiconductor device having intermediate electrode, comes to be in such a charged state, the semiconductor layer, which is located under the insulating film closer to the semiconductor element region than the intermediate electrode, will have an electric potential substantially equal to the electric potential of the semiconductor element region. On the other hand, the semiconductor layer, which is located below the intermediate electrode, will have an electric potential corresponding to the electric potential of the intermediate electrode. Therefore, the electric field will concentrate in the semiconductor layer near the edge of the intermediate electrode at the side of the semiconductor element region, and insulation breakdown can be easily caused in that semiconductor layer. As described above, the conventional semiconductor device having the intermediate electrode has a problem that a high electric strength can not be obtained when the insulating film is in the charged state. This specification discloses a semiconductor device having a higher electric strength.

Solution to Problem

The effect that the intermediate electrode suppresses the extension of the depleted layer (i.e. the effect that the equipotential lines, which extend from the semiconductor region toward the peripheral electrode, are stopped) varies depending on the position, the shape, and so on of the intermediate electrode. For example, if the insulating film under the intermediate electrode (i.e. the insulating film between the intermediate electrode and the semiconductor layer) is thinner, the electric potential of the semiconductor layer below the intermediate electrode is closer to the electric potential of the intermediate electrode. That is, the electric potential of that semiconductor layer is substantially fixed. Therefore, the effect to stop the equipotential lines becomes more prominent. Also, if the width of intermediate electrode (the width in the direction from semiconductor element region to the peripheral electrode) is larger, the electric potential of the semiconductor layer is affected in a wide range by the electric potential of the intermediate electrode. Consequently, the effect to stop the equipotential lines is more prominent.

On the other hand, if the effect to stop the equipotential lines is more prominent, larger number of the equipotential lines accumulates in the semiconductor layer below the intermediate electrode, and higher electric field is applied therein.

Based on these facts, the inventors created the semiconductor device having the intermediate electrode which can suppress the electric field concentration and stop the equipotential lines effectively. The structure of the semiconductor device is disclosed hereinbelow.

The first semiconductor device disclosed in this specification comprises a semiconductor element region, a peripheral termination region, a peripheral electrode, an insulating film and an intermediate electrode. A semiconductor element is formed within the semiconductor element region. The peripheral termination region is formed around the semiconductor element region and formed of a single conductive type semiconductor. The semiconductor element region and the peripheral termination region are exposed at one surface of a semiconductor substrate. The peripheral electrode is formed on a surface of the peripheral termination region and along a circumference of the semiconductor substrate. The peripheral electrode is electrically connected with the peripheral termination region. The insulating film is formed on the surface of the peripheral termination region and between the peripheral electrode and the semiconductor element region. The intermediate electrode is formed on the insulating film. A thickness of the insulating film under the intermediate electrode is smaller at a side of the peripheral electrode than at a side of the semiconductor element region.

Note that the term "semiconductor substrate" means a substrate formed of the semiconductor. In a case where insulating films, electrodes and so on are formed on a substrate, the semiconductor substrate is a part of the substrate excluding the insulating film, electrodes and so on. Therefore, the meaning of the term "exposed at one surface of the semiconductor substrate" includes a state where the semiconductor element region, the peripheral termination region and so on are exposed at the one surface of the semiconductor substrate, and that surface is covered with the insulating films, the electrodes and so on.

In this semiconductor device, the insulating film under the intermediate electrode is thicker at the position closer to the semiconductor element region. Therefore, fewer equipotential lines are stopped in the semiconductor layer under the thick insulating film. As a result, the high electric field concentration does not occur in the semiconductor layer under the thick insulating film.

Furthermore, the insulating film under the intermediate electrode is thinner at the position closer to the peripheral electrode. The effect to stop the equipotential lines is more prominent in the semiconductor layer under the thinner insulating film. However, because the predetermined number of the equipotential lines is stopped in the semiconductor layer closer to the semiconductor element region (i.e. the semiconductor layer under the thick insulating film), a number of the equipotential lines stopped in the semiconductor layer under the thin insulating film does not become so large. Therefore, the high electric field concentration also does not occur in the semiconductor layer under the thin insulating film.

As described above, in this semiconductor device, the intermediate electrode is formed so that the effect to stop the equipotential lines is not so prominent at the side of the semiconductor element region and is prominent at the side of the peripheral electrode. Consequently, the equipotential lines are stopped in a dispersed state and the electric field concentration does not easily occur. That is, while suppressing the electric field concentration, the extension of the equipotential lines toward the peripheral electrode (i.e. the extension of the depleted layer) is prevented.

Also, the intermediate electrode may be configured to surround the semiconductor element region.

Furthermore, the intermediate electrode may be insulated from the semiconductor element region and the peripheral electrode.

The second semiconductor device disclosed in this specification includes a semiconductor element region, a peripheral termination region, a peripheral electrode, an insulating film and a plurality of intermediate electrodes. A semiconductor element is formed within the semiconductor element region. The peripheral termination region is formed around the semiconductor element region, and formed of a single conductive type semiconductor. The semiconductor element region and the peripheral termination region are exposed at one surface of a semiconductor substrate. The peripheral electrode is formed on a surface of the peripheral termination region and along a circumference of the semiconductor substrate. The peripheral electrode is electrically connected with the peripheral termination region. The insulating film is formed on the surface of the peripheral termination region and between the peripheral electrode and the semiconductor element region. The plurality of the intermediate electrodes is formed on the insulating film. The plurality of the intermediate electrodes is disposed at an interval along a direction from the semiconductor element region to the peripheral electrode. A width of a first intermediate electrode in the direction, the first intermediate electrode being one of the intermediate electrodes closest to the semiconductor element region, is smaller than a width of a second intermediate electrode in the direction, the second intermediate electrode being one of the intermediate electrodes adjacent to the first intermediate electrode.

In this semiconductor device, the width of the first intermediate electrode closest to the semiconductor electrode is smaller than the width of the second intermediate electrode adjacent to the first intermediate electrode. Therefore, a few equipotential lines are stopped in the semiconductor layer below the first intermediate electrode. As a result, the high electric field concentration does not occur in the semiconductor layer below the first intermediate electrode.

Furthermore, because the second intermediate electrode is wider, the effect of the second intermediate electrode to stop the equipotential lines is more prominent. However, because the predetermined number of the equipotential lines is stopped in the semiconductor layer below the first intermediate electrode closest to the semiconductor element region, the number of the equipotential lines stopped in the semiconductor layer below the second intermediate electrode does not become so large. Therefore, the high electric field concentration also does not occur in the semiconductor layer below the second intermediate electrode.

As described above, in this semiconductor device, the first and the second intermediate electrodes are located so that the effect to stop the equipotential lines is not so prominent at the side of the semiconductor element region and is prominent at the side of the peripheral electrode. Consequently, the equipotential lines are stopped in a dispersed state and the electric field concentration does not easily occur. That is, while suppressing the electric field concentration, the extension of the equipotential lines toward the peripheral electrode (i.e. the extension of the depleted layer) is prevented.

Also, each of the intermediate electrodes may be configured to surround the semiconductor element region.

Furthermore, each of the intermediate electrodes may be insulated from the semiconductor element region and the peripheral electrode.

The third semiconductor device disclosed in this specification includes a semiconductor element region, a peripheral termination region, a peripheral electrode, an insulating film and one or more intermediate electrodes. A semiconductor element is formed within the semiconductor element region. The peripheral termination region is formed around the semiconductor element region and formed of a single conductive type semiconductor. The semiconductor element region and the peripheral termination region are exposed at one surface of a semiconductor substrate. The peripheral electrode is formed on a surface of the peripheral termination region and along a circumference of the semiconductor substrate. The peripheral electrode is electrically connected with the peripheral termination region. The insulating film is formed on the surface of the peripheral termination region and between the peripheral electrode and the semiconductor element region. The one or more intermediate electrodes are formed on the insulating film. The one or more intermediate electrodes are formed so that an effect to stop equipotential lines extending from the semiconductor element region to the peripheral electrode is more prominent at a side of the peripheral electrode than at a side of the semiconductor element region.

In this semiconductor device, the equipotential lines are stopped in the dispersed state and the electric field concentration does not easily occur. That is, while suppressing the electric field concentration, the extension of the equipotential lines toward the peripheral electrode is prevented.

Advantageous Effect of the Invention

The semiconductor devices disclosed in this specification has high electric strength, because the electric field concentration does not occur easily in the semiconductor layer.

DETAILED DESCRIPTION OF THE PREFERRED EMBODIMENTS

First Embodiment

Figure 1:
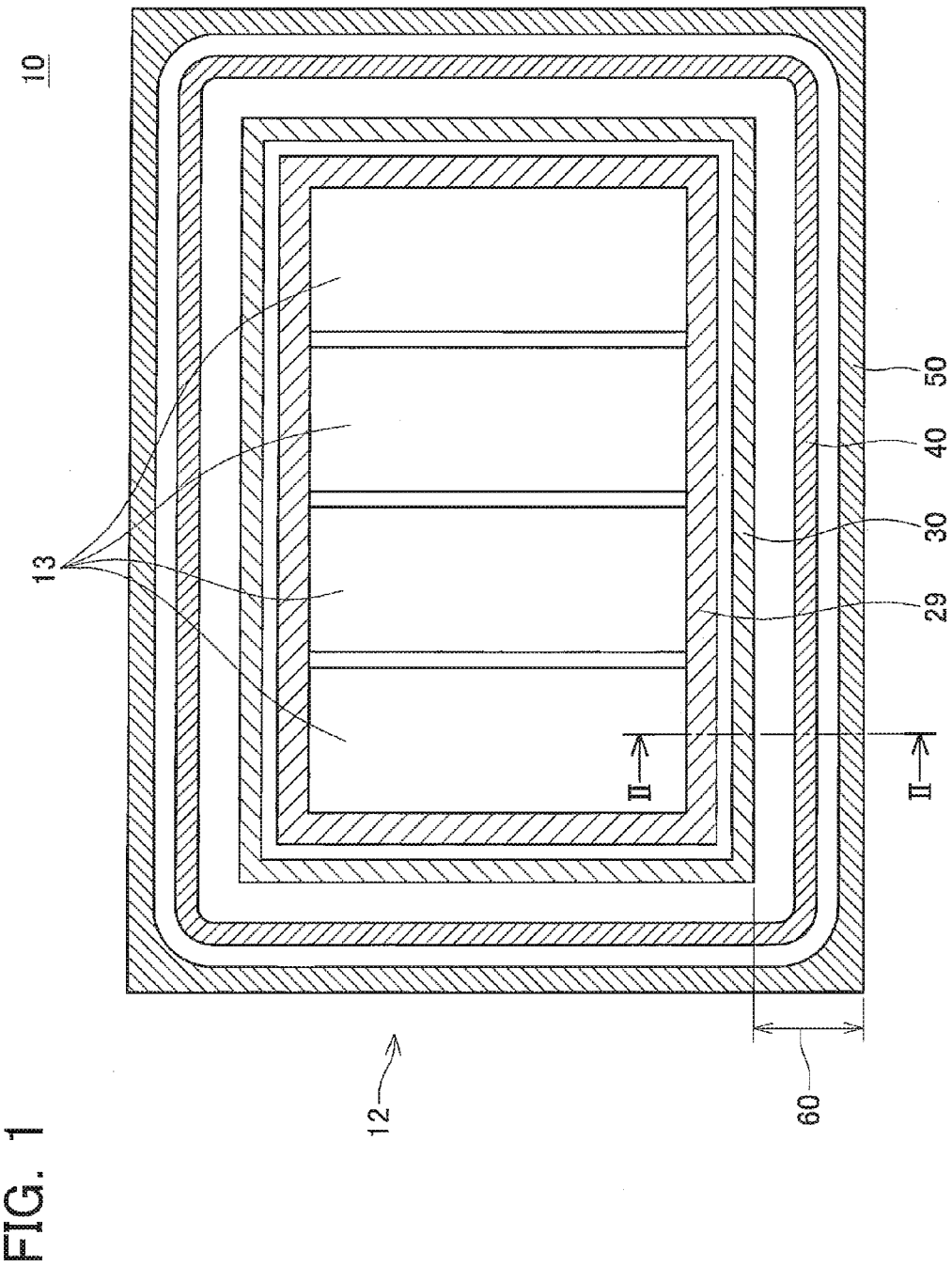
FIG. 1 shows a top view of an IGBT 10 of the first embodiment.

FIG. 1 shows a top view of an IGBT 10 (a semiconductor device) of the first embodiment. The IGBT 10 is configured by a semiconductor substrate 12, electrodes, insulating films and so on which are formed on an upper surface 12a and a lower surface 12b of the semiconductor substrate 12. Note that the electrodes and the insulating films formed on the semiconductor substrate 12 with exceptions of an intermediate electrode 40 and a peripheral electrode 50, are not indicated in FIG. 1. As shown in FIG. 1, four semiconductor element regions 13 are formed in the semiconductor substrate 12. Within the semiconductor element regions 13, IGBT structures are formed. An FLR 29, an FLR 30 and a peripheral termination region 60 are formed in the semiconductor substrate 12 to surround the four semiconductor element regions 13. On the peripheral termination region 60, the intermediate electrode 40 and the peripheral electrode 50 are formed. Note that the FLR 29, the FLR 30, the intermediate electrode 40 and the peripheral electrode 50 are indicated by the hatching lines for the purpose of easier view.

Figure 2:
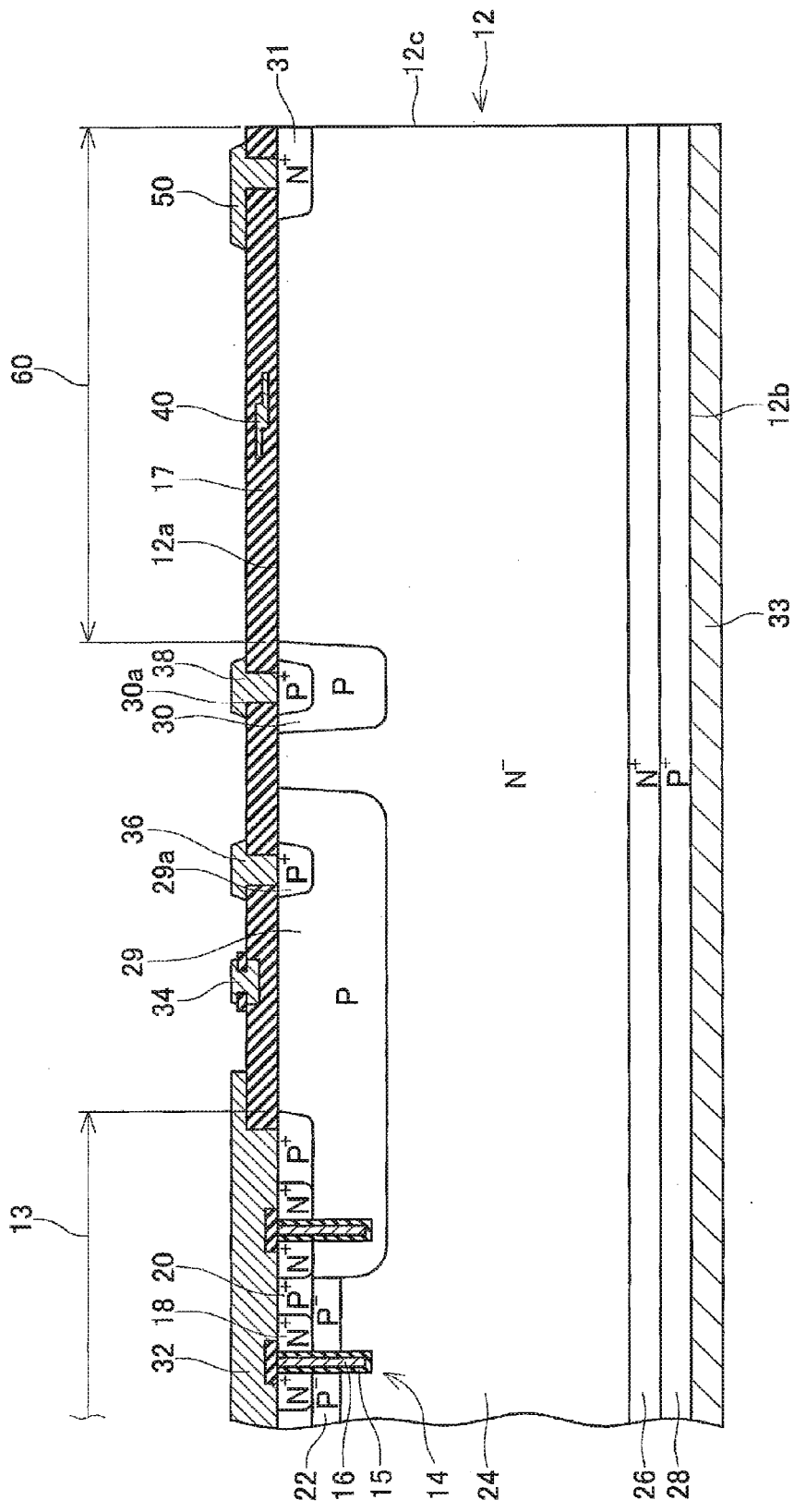
FIG. 2 shows a cross-sectional view of the IGBT 10 of the first embodiment.

FIG. 2 shows a cross-sectional view of the IGBT 10 at the line II-II of FIG. 1. As shown in FIG. 2, a plurality of trenches 14 is formed at the upper surface 12a of the semiconductor substrate 12. The inner surface of each of the trenches is covered with a gate insulating film 15. In each of the trenches 14, a gate electrode 16 is formed. In a range exposed at the upper surface 12a of the semiconductor substrate 12, emitter regions 18 and body contact regions 20 are formed. Each of the emitter regions 18 is an n-type region including n-type impurities at high density. Each of the emitter regions 18 is formed to be in contact with the gate insulating film 15. Each of the body contact regions 20 is a p-type region including p-type impurities at high density. Each of the body contact regions 20 is formed to be in contact with the emitter regions 18. Around the emitter regions 18 and the body contact regions 20, the body region 22 is formed. The body region 22 is a p-type region including the p-type impurities at low density. The body region 22 covers the emitter regions 18 and the body contact regions 20. Under the body region 22, a drift region 24 is formed. The drift region 24 is an n-type region including the n-type impurities at low density. The drift region 24 is separated from the emitter regions 18 by the body region 22. The trenches 14 described above penetrate the body region 22 to reach the drift region 24. The drift region 24 is formed to reach a circumference portion 12c of the semiconductor substrate 12. Under the drift region 24, a buffer region 26 is formed. The buffer region 26 is an n-type region including n-type impurities at high density. Under the buffer region 26 (a range exposed at a lower surface 12b of the semiconductor substrate 12), a collector region 28 is formed. The collector region 28 is a p-type region including the p-type impurities at high density. The collector region 28 is separated from the body region 22 by the drift region 24.

IGBT structures are formed by the emitter regions 18, the body contact regions 20, the body region 22, the drift region 24, the buffer region 26, the collector region 28 and the gate electrodes 16 described above. A region at which the IGBT structure is exposed within the upper surface 12a of the semiconductor substrate 12 (i.e. a region at which the emitter regions 18, the body contact regions 20 and the body region 22 are exposed) is the semiconductor element region 13 described above.

In the semiconductor substrate 12, the FLRs 29, 30 are formed. The FLRs 29, 30 are p-type regions. The FLRs 29, 30 are formed between the upper surface 12a of the semiconductor substrate 12 and a position deeper than the body region 22. The FLR 29 is formed to be in contact with the body region 22. As seen in FIG. 1, the FLR 29 is formed to surround the four semiconductor elements 13. Within the FLR 29, a region 29a having high density p-type impurities is formed. The FLR 30 is separated from the FLR 29; the drift region 24 exists between the FLR 29 and the FLR 30. As shown in FIG. 1, the FLR 30 is formed to surround the FLR 29. Within the FLR 30, a region 30a having high density p-type impurities is formed.

As shown in FIG. 2, in a range exposed at the upper surface 12a of the semiconductor substrate 12, a peripheral diffused region 31 is formed. The peripheral diffused region 31 is an n-type region including the n-type impurities at high density. The peripheral diffused region 31 is formed along the circumference portion 12c of the semiconductor substrate 12. In the range closer to the circumference portion 12c than the FLR 30 and exposed at the upper surface 12a of the semiconductor substrate 12, the drift region 24 is formed. The peripheral termination region 60 is formed by the peripheral diffused region 31 and the drift region 24 located at a range closer to the circumference portion 12c than the FLR 30. The peripheral termination region 60 is formed of a single conductive type of semiconductor (i.e. an n-type semiconductor).

On the upper surface 12a of the semiconductor substrate 12, an interlayer dielectric film 17 is formed. On a surface of the interlayer dielectric film 17 located on the semiconductor element region 13, an emitter electrode 32 is formed. The emitter electrode 32 is connected with the emitter regions 18 and the body contact regions 20 via the opening formed in the interlayer dielectric film 17. The emitter electrode 32 is insulated from the gate electrode 16 by the interlayer dielectric film 17.

On the whole of the lower surface 12b of the semiconductor substrate 12, a collector electrode 33 is formed. The collector electrode 33 is electrically connected with the collector region 28.

On the surface of the interlayer dielectric film 17, a gate line 34 is formed. At a location not illustrated in the drawings, the gate line 34 is connected to each of the gate electrodes 16.

On the surface of the interlayer dielectric film 17 located on the FLR 29, an electrode 36 is formed. The electrode 36 is electrically connected to the region 29a via an opening formed in the interlayer dielectric film 17. That is, the electrode 36 is electrically connected to the FLR 29 via the region 29a. The electrode 36 is formed along the FLR 29.

On the surface of the interlayer dielectric film 17 located on the FLR 30, an electrode 38 is formed. The electrode 38 is electrically connected to the region 30a via an opening formed in the interlayer dielectric film 17. That is, the electrode 38 is electrically connected to the FLR 30 via the region 30a. The electrode 38 is formed along the FLR 30.

On the surface of the interlayer dielectric film 17 located on the peripheral diffused region 31, the peripheral electrode 50 is formed. The peripheral electrode 50 is electrically connected to the peripheral diffused region 31 via an opening formed in the interlayer dielectric film 17. The peripheral electrode 50 is formed along the peripheral diffused region 31 (i.e. along the circumference portion 12c of the semiconductor substrate 12).

Figure 3:
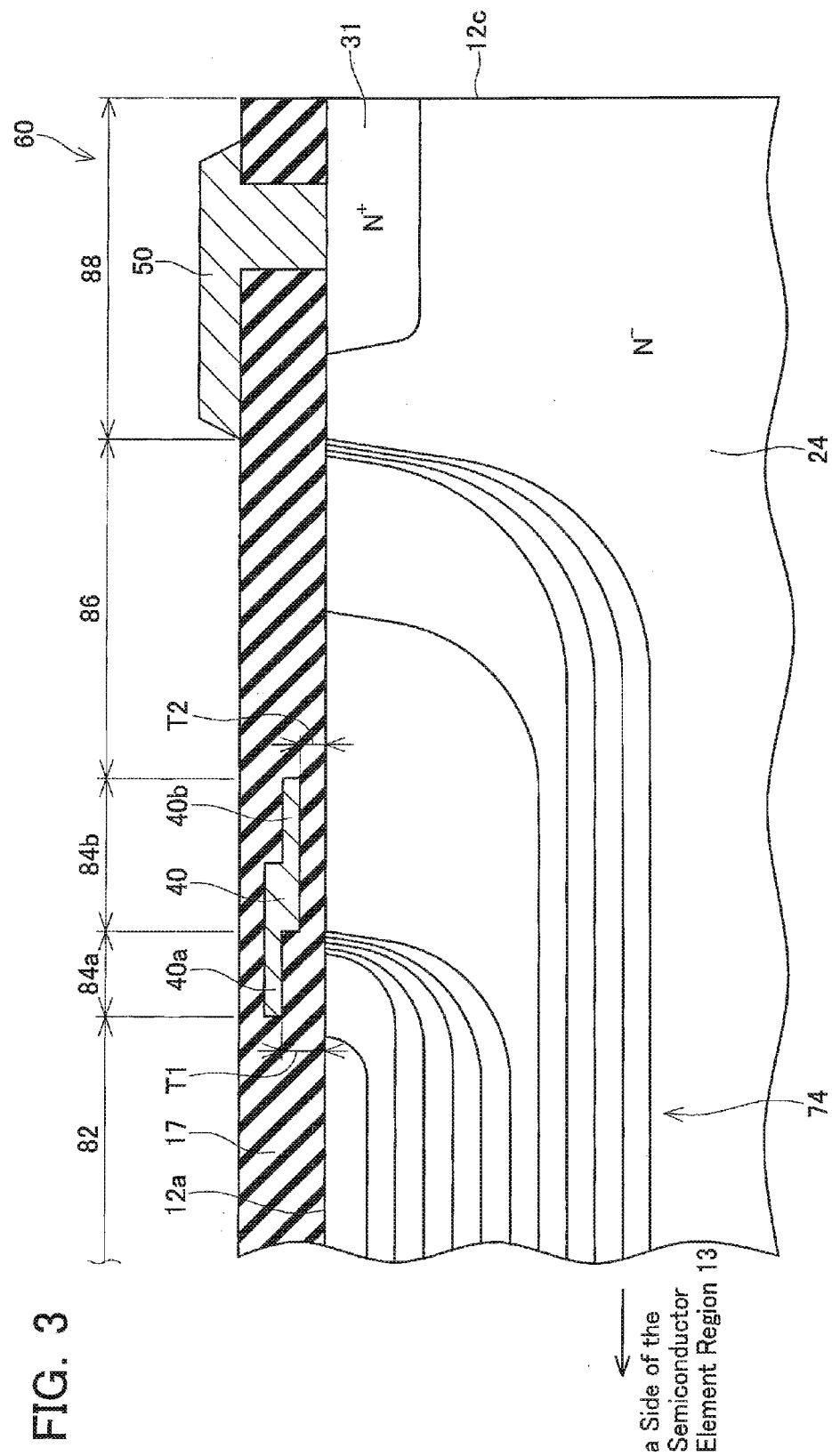
FIG. 3 shows an enlarged cross-sectional view of a peripheral termination region 60 of an IGBT 10 of the first embodiment.

In the interlayer dielectric film 17 located on the drift region 24 within the peripheral termination region 60, the intermediate electrode 40 is implanted. The intermediate electrode 40 is surrounded by the interlayer dielectric film 17 and is not electrically connected to the external. That is, the interlayer electrode 40 is floating. As shown in FIG. 1, the intermediate electrode 30 is formed to surround the four semiconductor element region 13. FIG. 3 shows an enlarged cross-sectional view of the peripheral termination region 60. As shown in FIG. 3, a step is formed at the intermediate electrode 40. At a portion of the intermediate electrode 40 closer to the semiconductor element region 13 (hereinafter, referred to as a first portion 40a), a thickness of the interlayer dielectric layer 17 located under the first portion 40a (i.e. the thickness T1 in FIG. 3) is thick. At a portion of the intermediate electrode 40 closer to the circumference portion 12c (hereinafter, referred to as a second portion 40b), a thickness of the interlayer dielectric layer 17 located under the second portion 40b (i.e. the thickness T2 in FIG. 3) is thin. That is, the second portion 40b is closer to the drift region 24 than the first portion 40a. An entirety of the intermediate electrode 40 is formed so that the second portion 40b, which is further away from the semiconductor element region 13, exists at a position closer to the drift region 24 than the first portion 40a, which is closer to the semiconductor element region 13.

Next, an operation of the IGBT 10 is described. When making the IGBT 10 turn on, a voltage is applied between the collector electrode 33 and the emitter electrode 32 so that the electric potential of the collector electrode 33 is positive. Furthermore, a predetermined voltage is applied to the gate electrodes 16. When the voltage is applied to the gate electrodes 16, a portion of the body region 22 which is in contact with the gate insulating film 15 reverses to n-type, and channels are formed thereat. Then, electrons flow from the emitter electrode 32 to the collector electrode 33 via the emitter regions 18, the channels within the body region 22, the drift region 24, the buffer region 26 and the collector region 28. Furthermore, holes flow from the collector electrode 33 to the drift region 24 via the collector region 28 and the buffer region 26. As a result, a conductivity modulation occurs and the electric resistance of the drift region 24 decreases. Therefore, the electrons can flow within the drift region 24 at low energy loss. As a result, electric current flows from the collector electrode 33 to the emitter electrode 32. That is, the IGBT 10 turns on.

When applying the voltage to the gate electrode 16 is stopped, the channels disappear. Therefore, the flow of electrons and holes are stopped and the IGBT turns off. In a state where the IGBT 10 is off, the voltage between the collector electrode 33 and the emitter electrode 32 is applied at a p-n junction which is the boundary between the body region 22 and the drift region 24. That is, a reverse voltage is applied to the p-n junction between the body region 22 and the drift region 24. Then a depleted layer extends within the drift region 24 from the p-n junction. The electric strength of the IGBT 10 in the off state is ensured by the depleted layer. If a thin part exists in the depleted layer, the electric field concentrates to the thin part and insulation breakdown occurs. In the IGBT 10, the extension of the depleted layer within the drift region 24 near the semiconductor element region 13 is accelerated by the FLRs 29, 30. As a result, the electric field is prevented from concentrating near the semiconductor element region 13.

When the IGBT 10 is off, the voltage is also applied between the semiconductor element region 13 and the circumference portion 12c. Therefore, the depleted layer extends within the peripheral termination region 60 from the semiconductor element region 13 to the circumference portion 12c. If the depleted layer reaches the circumference portion 12c, the electric field is applied to the circumference portion 12c. Because there are many crystal defects in the circumference portion 12c, if the electric field is applied to the circumference portion 12c, problems of the insulation breakdown and so on occur. In the IGBT 10 of the first embodiment, the intermediate electrode 40 and the peripheral electrode 50 are formed in order to suppress the extension of the depleted layer toward the side of the circumference portion 12c. The depleted layer is terminated by the function of the intermediate electrode 40 and the peripheral electrode 50, so the depleted layer is prevented from reaching the circumference portion 12c. On the other hand, when using the IGBT 10, the interlayer dielectric film 17 may be charged. In this case, the electric potential is distributed uniformly within the drift region 24 near the interlayer dielectric film 17. Therefore, when the interlayer dielectric film 17 is in the charged state, it becomes easy for the concentration of the electric field to occur at the terminating end part of the depleted layer. An electric field distribution within the peripheral termination region 60 of the IGBT 10 of the first embodiment, which exists in a case where the interlayer dielectric film 17 is in the charged state, is described below by comparing to an electric field distribution within a peripheral termination region of a conventional IGBT.

Figure 4:
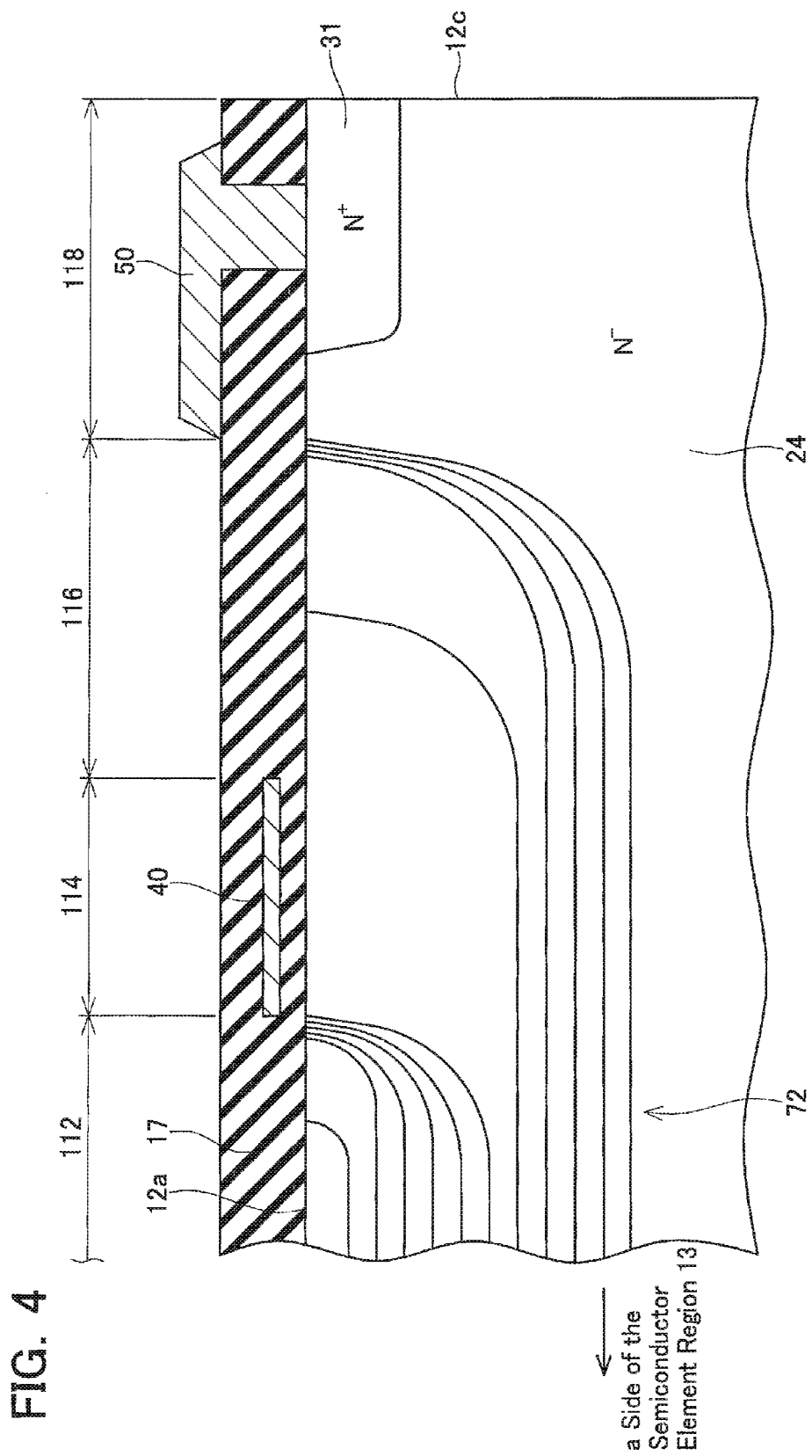
FIG. 4 shows an enlarged cross-sectional view of a peripheral termination region of a conventional IGBT.

FIG. 4 shows a cross-sectional view of the peripheral termination region of the conventional IGBT. Note that the same reference numbers as the IGBT 10 of the first embodiment are given to corresponding portions of the conventional IGBT. Unlike the IGBT 10 of the first embodiment, the step is not formed at the intermediate electrode of the conventional IGBT. That is, the thickness of the interlayer dielectric film 17 between the intermediate electrode 40 and the drift region 24 is uniform. Curve lines 72 in FIG. 4 indicate equipotential lines generated within the peripheral termination region when the interlayer dielectric film 17 is in the charged state.

When the IGBT is in the off state, the electric potential of the peripheral electrode 50 is substantially equal to the electric potential of the collector electrode 33. On the other hand, the electric potential of the intermediate electrode 40 is the value between the electric potential of the peripheral electrode 50 and the electric potential of the emitter electrode 32 because the intermediate electrode 40 is between the peripheral electrode 50 and the semiconductor element region 13 (i.e. the emitter electrode 32). If the interlayer dielectric film 17 is in the charged state, the electric potential at the surface layer of the drift region 24 closer to the semiconductor element region 13 than the intermediate electrode 40 (i.e. the electric potential at the surface layer of the drift region 24 within the range 112 of FIG. 4) becomes substantially uniform. Therefore, most of the equipotential lines within the range 112 extend toward a side of the circumference portion 12c. The electric potential at the surface layer of the drift region 24 located below the intermediate electrode 40 (i.e. the electric potential at the surface layer of the drift region 24 within the range 114) is affected by the electric potential of the intermediate electrode 40. Therefore, the electric potential at the surface layer of the drift region 24 within the range 114 is higher than the electric potential at the surface layer of the drift region 24 within the range 112. As a result, the electric potential changes sharply at the boundary between the range 112 and the range 114. Therefore, as shown in FIG. 4, many equipotential lines extend upward at the boundary between the range 112 and the range 114. So the electric field concentrates at the boundary between the range 112 and the range 114. The electric potential at the surface layer of the drift region 24 closer to the circumference portion 12c than the intermediate electrode 40 (i.e. the electric potential at the surface layer of the drift region 24 within the range 116 of FIG. 4) becomes substantially uniform because of the electrification of the interlayer dielectric film 17. That is, the electric potential at the surface layer of the drift region 24 within the range 116 is substantially equal to the electric potential at the surface layer of the drift region 24 within the range 114. Therefore, within the range 114 and the range 116, most of the equipotential lines extend toward the side of the circumference portion 12c. As described above, the electric potential of the peripheral electrode 50 is substantially equal to the electric potential of the collector region 33. Furthermore, because the peripheral diffused region 31 is conducted with the peripheral electrode 50, the electric potential of the peripheral diffused region 31 is substantially equal to the peripheral electrode 50. As a result, the electric potential at the surface layer of the semiconductor substrate 12 located under the peripheral electrode 50 (i.e. the electric potential at the surface layer of the semiconductor substrate within the range 118 of FIG. 4) is substantially equal to the electric potential of the collector electrode 33. Therefore, the electric potential changes at the boundary between the range 116 and the range 118. So, as shown in FIG. 4, the equipotential lines extend toward the upper surface 12a at the boundary of the range 116 and the range 118. Consequently, relatively high electric field occurs at the boundary of the range 116 and the range 118.

Figure 5:
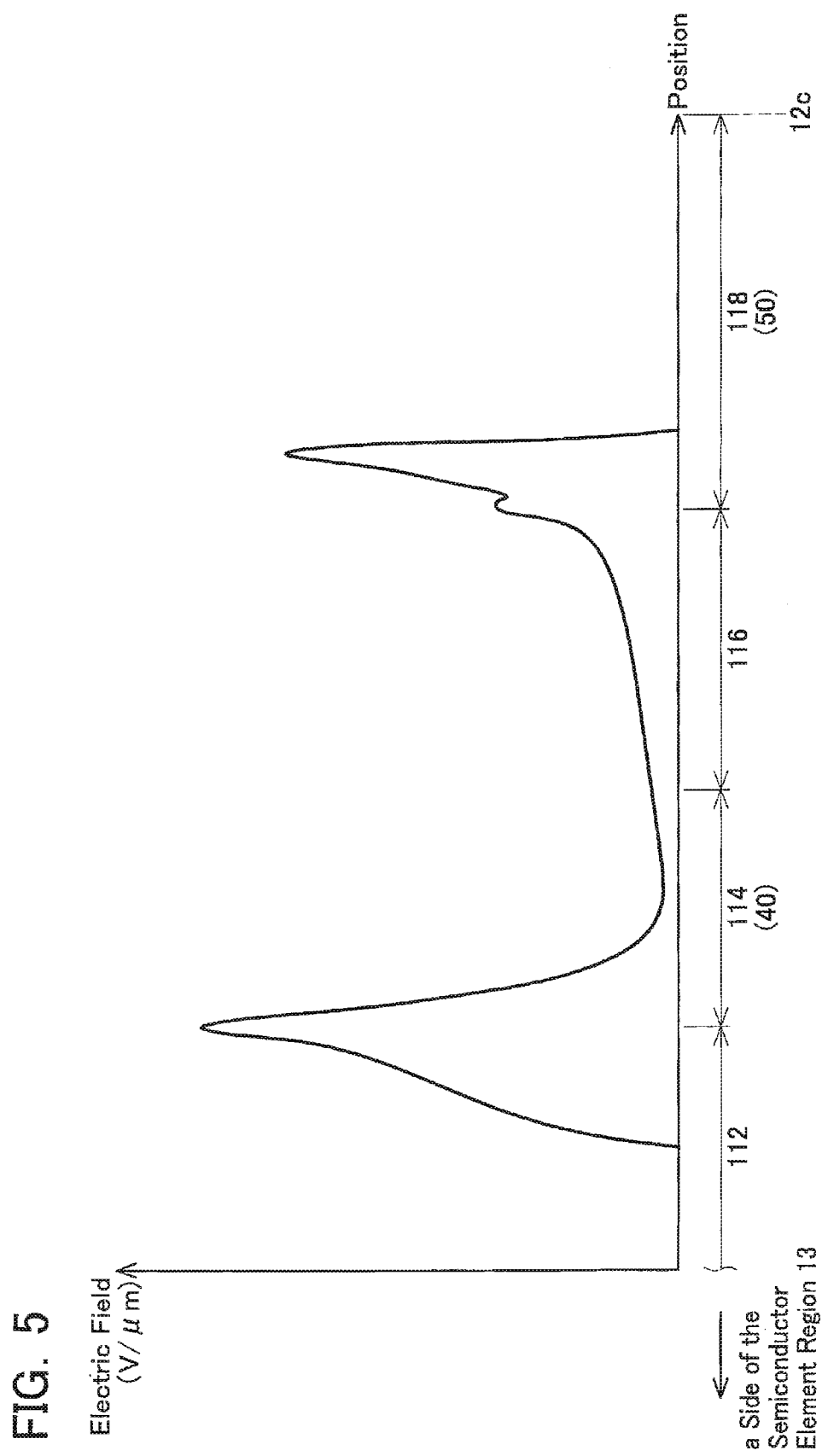
FIG. 5 is a graph showing an electric field distribution within an upper surface 12a layer of the peripheral termination region of a semiconductor substrate 12 of the conventional IGBT.

As described above, in the conventional IGBT, the equipotential lines are stopped by the intermediate electrode 40 and the peripheral electrode 50, so the equipotential lines are prevented from reaching the circumference portion 12c. In other words, the depleted layer is prevented from reaching the circumference portion 12c. However, with the conventional IGBT, the electric field is concentrated in the drift region 24 near the intermediate electrode 40. FIG. 5 shows the electric field distribution at the surface layer of the peripheral termination region of the semiconductor substrate of the conventional IGBT. As shown in FIG. 5, the highest electric field occurs near the edge of the intermediate electrode 40 which is at the side of the semiconductor element region 13 (i.e. left edge of the range 114). Therefore, the conventional IGBT has a problem that the electric strength is low.

Lines 74 in FIG. 3 indicate equipotential lines within the peripheral termination region 60 of the IGBT 10 of the first embodiment, which are generated when the IGBT 10 is in the off state and the interlayer dielectric film 17 is in the charged state. With the IGBT 10 of the first embodiment, the electric potential of the peripheral electrode 50 is substantially equal to the electric potential of the collector electrode 33 and the electric potential of the intermediate electrode 40 is the value between the electric potential of the peripheral electrode 50 and the electric potential of the emitter electrode 32, as well as the conventional IGBT.

The electric potential at the surface layer of the drift region 24 closer to the semiconductor element region than the intermediate electrode 40 (i.e. the electric potential at the surface layer of the drift region 24 within the range 82 of FIG. 3) becomes uniform due to the effect of the electrification of the interlayer dielectric film 17. Within the range 82, most of the equipotential lines extend toward the side of the circumference portion 12c. The electric potential at the surface layer of the drift region 24 located below the intermediate electrode 40 is affected by the electric potential of the intermediate electrode 40. It should be noted that the electric potential at the surface layer of the drift region 24 located below the first portion 40a of the intermediate electrode 40 is different from the electric potential at the surface layer of the drift region 24 located below the second portion 40b of the intermediate electrode 40, because the thickness of the interlayer dielectric film 17 located under the first portion 40a is different from the thickness of the interlayer dielectric film 17 located under the second portion 40b. Because the first portion 40a is farther away from the drift region 24 (i.e. the underlying interlayer dielectric film 17 is thicker), the effect which the first portion 40a gives to the electric potential at the surface layer of the drift region 24 located below the first portion 40a is relatively small. Therefore, the electric potential at the surface layer of the drift region 24 located below the first portion 40a (i.e. the electric potential at the surface layer of the drift region 24 within the range 84a of FIG. 3) is higher than the electric potential at the surface layer of the drift region 24 within the range 82, but this potential difference is small. As a result, as shown in FIG. 3, a small number of the equipotential lines 12a extend upward at the boundary of the range 82 and the range 84a. The electric field which occurs at the boundary of the range 82 and the range 84a is not so high. On the other hand, because the second portion 40b is closer to the drift region 24 (i.e. the underlying interlayer dielectric film 17 is thinner), the effect which the second portion 40b gives to the electric potential at the surface layer of the drift region 24 located below the second portion 40b is large. Therefore, the electric potential at the surface layer of the drift region 24 located below the second portion 40b (i.e. the electric potential at the surface layer of the drift region 24 within the range 84b of FIG. 3) is higher than the electric potential at the surface layer of the drift region 24 within the range 84a. Note that the electric potential at the surface layer of the drift region 24 within the range 84a is increased by the effect of the first portion 40a. Therefore, as shown in FIG. 3, a small number of the equipotential lines extend upward at the boundary of the range 84a and the range 84b. The electric field which occurs at the boundary of the range 84a and the range 84b is not so high. The electric potential at the surface layer of the drift region 24 closer to the circumference portion 12c than the intermediate electrode 40 (i.e. the electric potential at the surface layer of the drift region 24 within the range 86 of FIG. 3) becomes substantially uniform due to the effect of the electrification of the interlayer dielectric film 17. That is, the electric potential at the surface layer of the drift region 24 within the range 86 becomes substantially equal to the electric potential at the surface layer of the drift region within the range 84b. Therefore, the equipotential lines extend within the range 84 and the range 86 toward the side of the circumference portion 12c. The electric potential at the surface layer of the semiconductor substrate 12 under the peripheral electrode 50 (the electric potential at the surface layer of the semiconductor substrate 12 within the range 88 of FIG. 3) is substantially equal to the electric potential of the collector electrode 33. Therefore, the equipotential lines extend upward at the boundary of the range 86 and the range 88, and the relatively high electric field occurs at the boundary.

Figure 6:
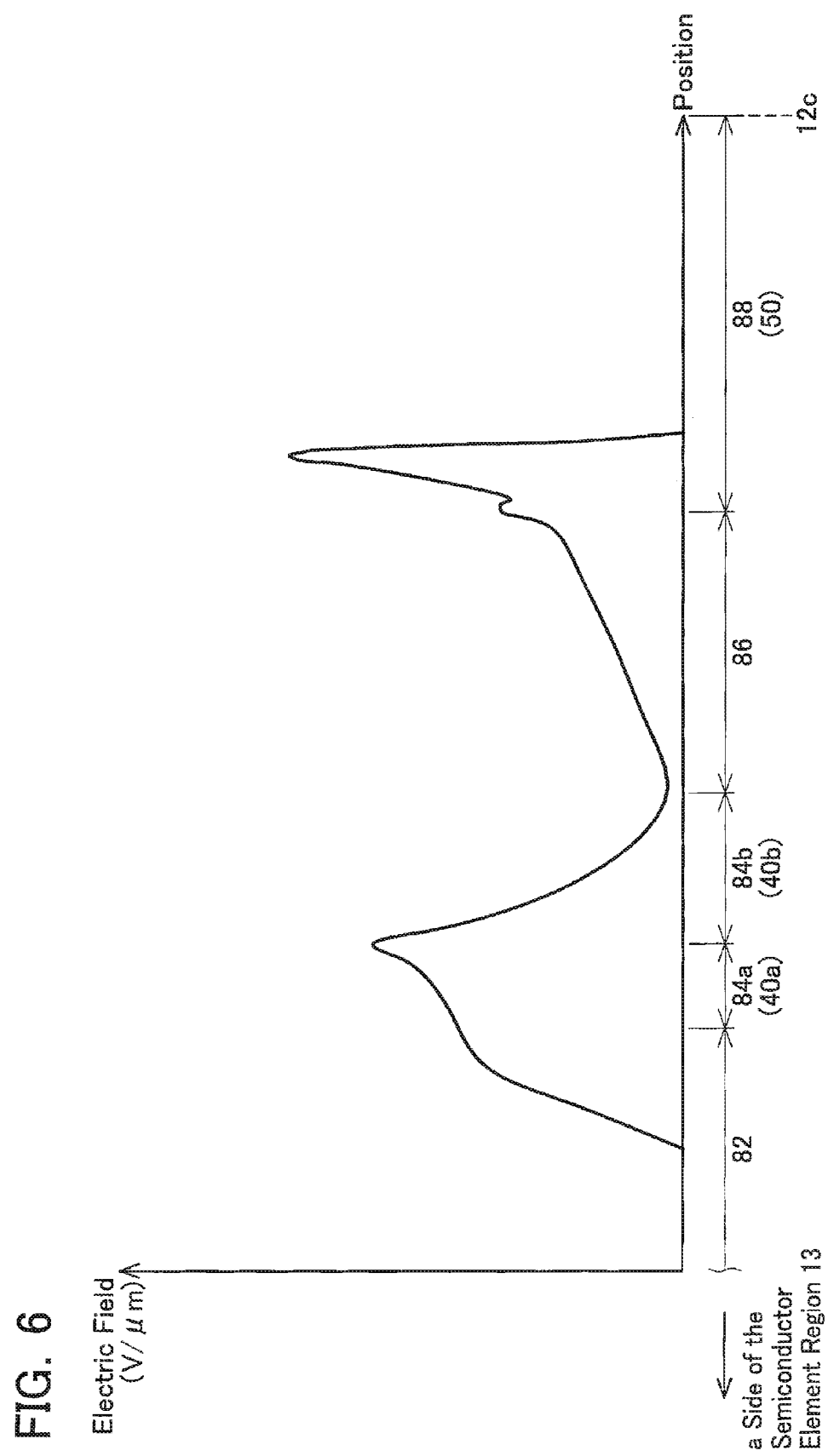
FIG. 6 is a graph showing an electric field distribution within an upper surface 12a layer of the peripheral termination region 60 of a semiconductor substrate 12 of the IGBT 10 of the first embodiment.

As described above, with the IGBT 10 of the first embodiment, the equipotential lines are stopped by the intermediate electrode 40 and the peripheral electrode 50. Consequently, the equipotential lines are prevented from reaching the circumference portion 12c. That is, the depleted layer is prevented from reaching the circumference portion 12c. Furthermore, the interlayer dielectric film 17 under the intermediate electrode 40 is thinner at the side of the semiconductor element region 31 than at the side of the circumference portion 12c. Therefore, the electric potential varies moderately near the intermediate electrode 40. As a result, the electric field is prevented from concentrating near the intermediate electrode 40. FIG. 6 is a graph showing the electric field distribution at the surface layer of the peripheral strength region 60 of the IGBT 10 of the first embodiment. As shown in FIG. 6, as a result of the suppression of the electric field concentration, the electric field near the intermediate electrode 40 is smaller than the electric field near the peripheral electrode 50. The IGBT 10 of the first embodiment has higher electric strength than the conventional IGBT.

As described above, in the IGBT 10 of the first embodiment, the interlayer dielectric film 17 under the intermediate electrode 40 is thinner at the side of the circumference portion 12c than at the side of the semiconductor element region 13. Therefore, the electric potential in the drift region 24 below the intermediate electrode 40 can be moderately changed and the equipotential lines in the drift region 24 can be stopped (i.e. the depleted layer can be terminated). Therefore, while suppressing the concentration of the electric field, the depleted layer can be terminated.

Figure 7:
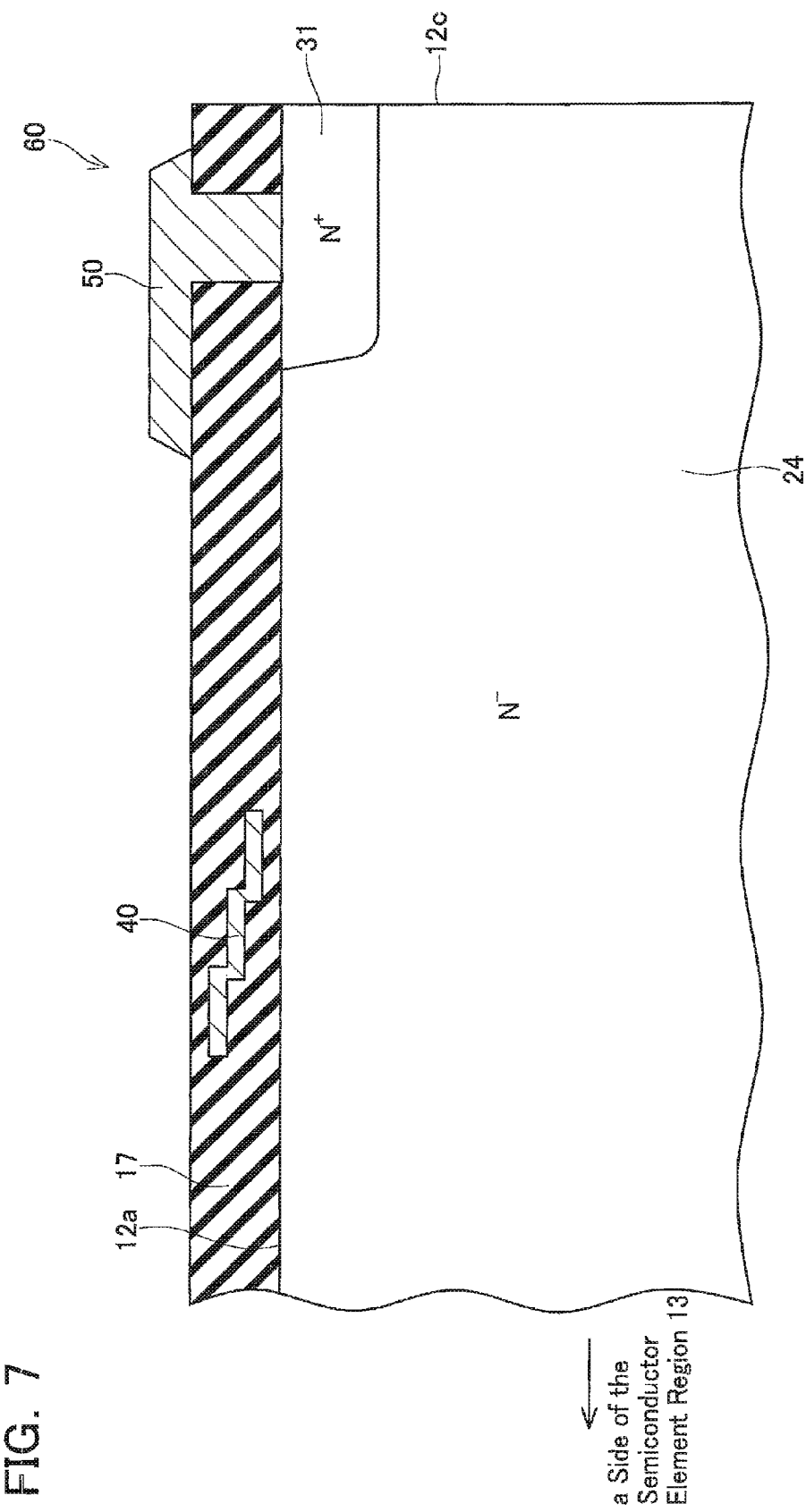
FIG. 7 shows an enlarged cross-sectional view of a peripheral termination region 60 of an IGBT of the first variant embodiment.
Figure 8:
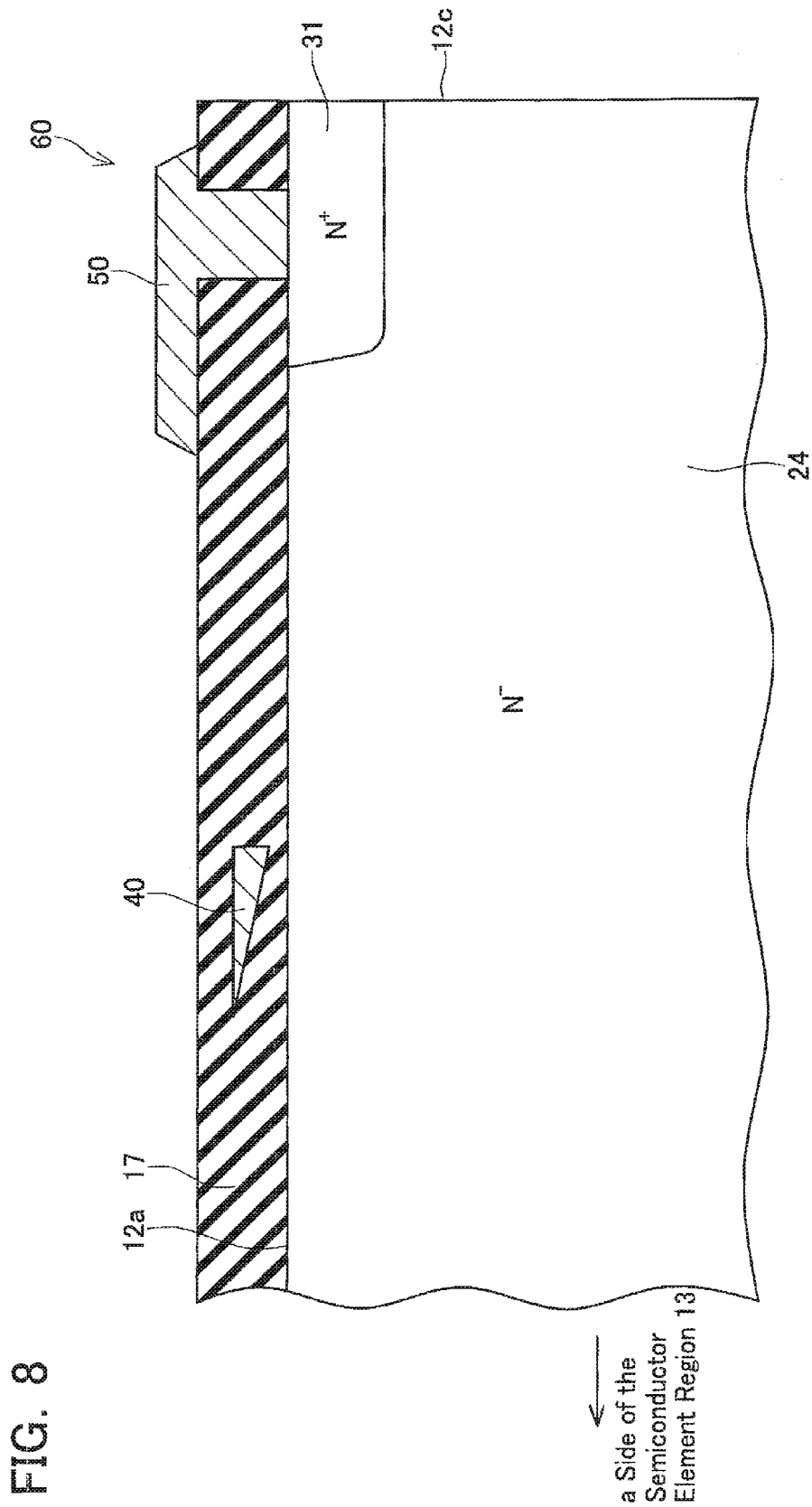
FIG. 8 shows an enlarged cross-sectional view of a peripheral termination region 60 of an IGBT of the second variant embodiment.

Note that the intermediate electrode 40 of the above-described IGBT 10 of the first embodiment is formed into the stepped shape having two steps, but the intermediate electrode 40 can alternately be formed into a stepped shape having three steps as shown in FIG. 7. Furthermore, the intermediate electrode 40 can alternately be formed into a stepped shape having more than three steps. Moreover, the thickness of the interlayer dielectric film 17 under the intermediate electrode 40 can alternately be changed gradually as shown in FIG. 8.

Figure 9:
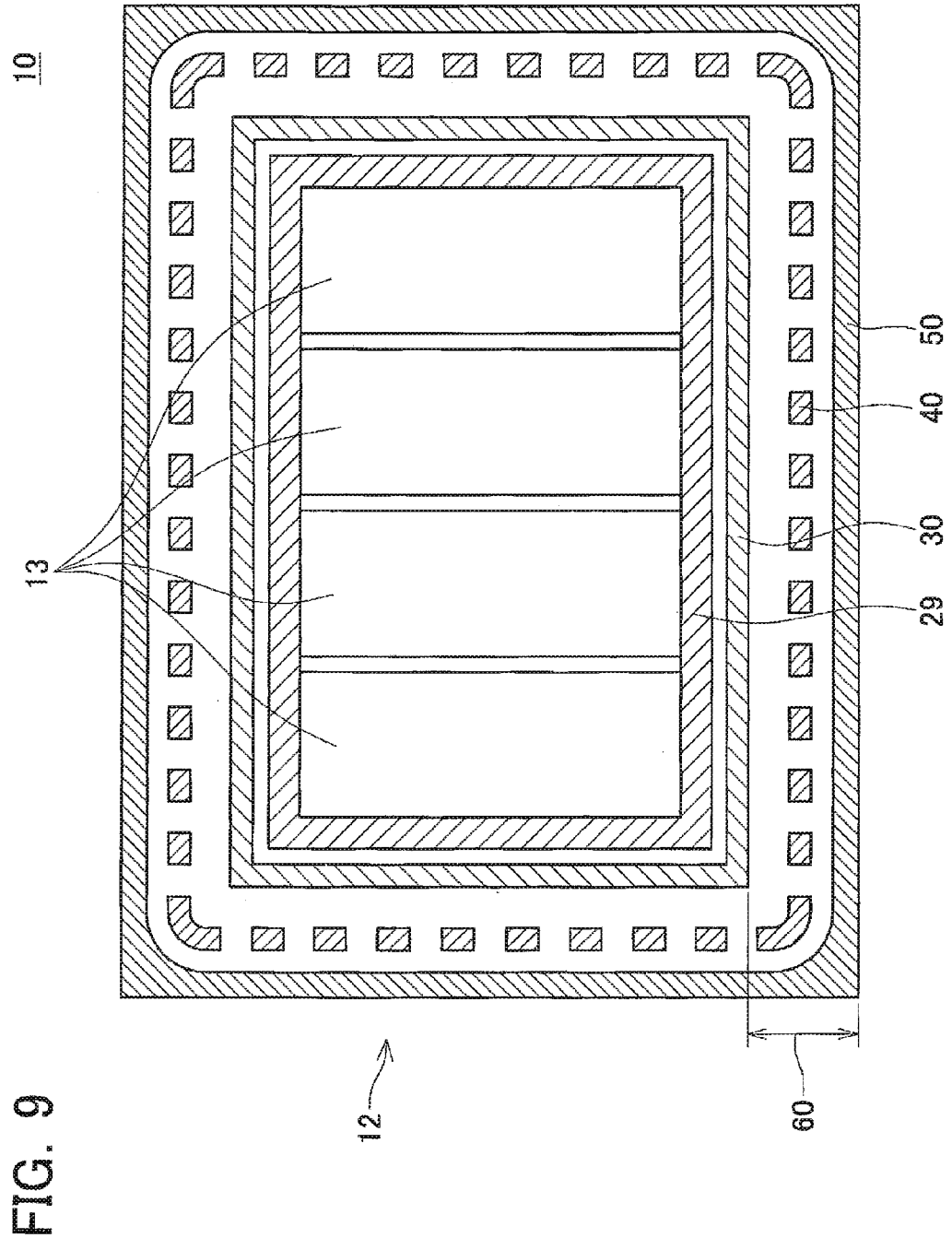
FIG. 9 shows a top view of an IGBT of the third variant embodiment.

Also, the intermediate electrode 40 of the above-described IGBT 10 of the first embodiment is formed so that the intermediate electrode 40 surrounds the semiconductor element region 13. Alternately, as shown in FIG. 9, the intermediate electrode 40 can be formed partially. The intermediate electrode 40 can be formed as needed at positions that are required to suppress the extension of the depleted layer.

Second Embodiment

Figure 10:
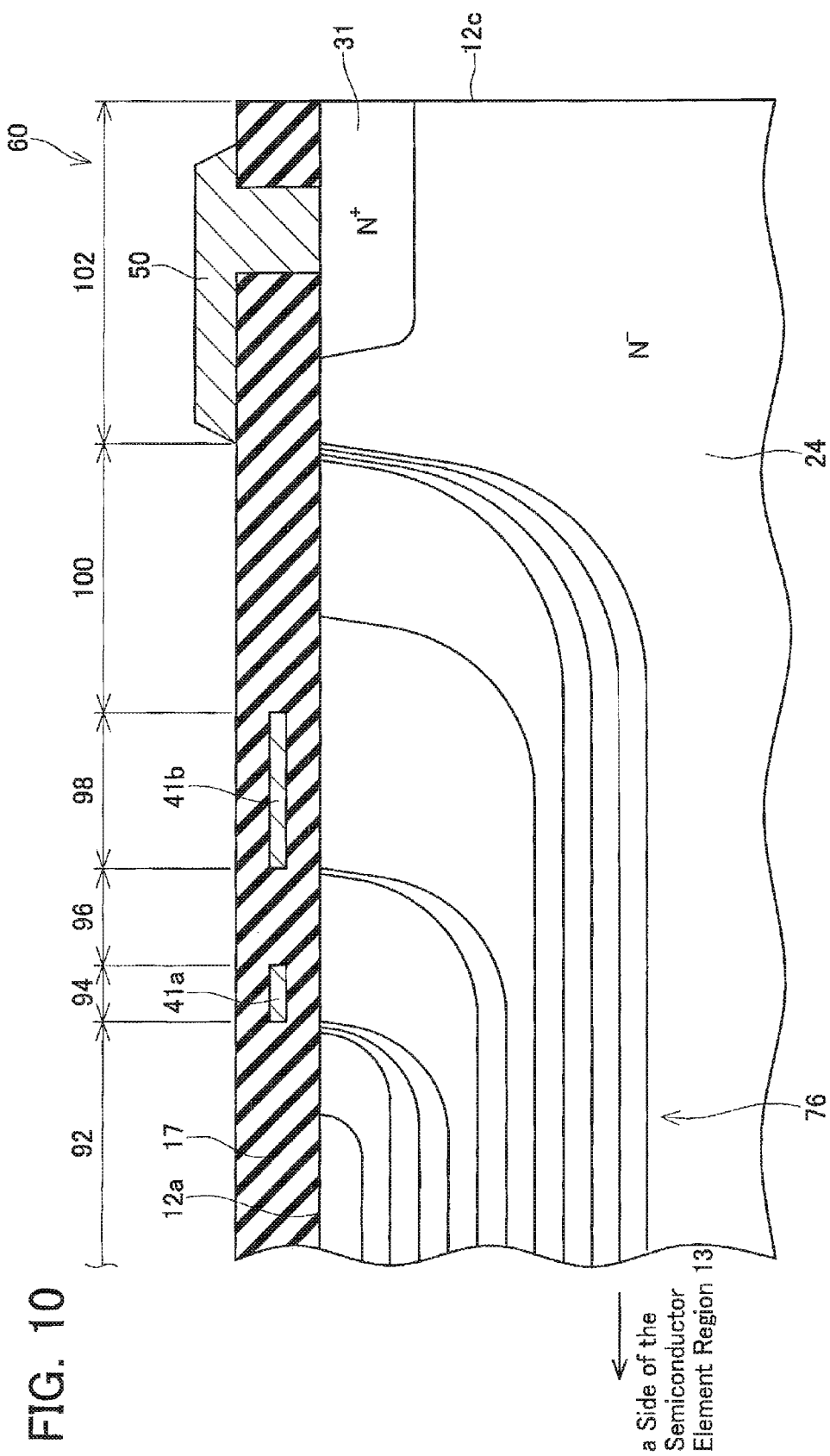
FIG. 10 shows an enlarged cross-sectional view of a peripheral termination region 60 of an IGBT 110 of the second embodiment.
Figure 11:
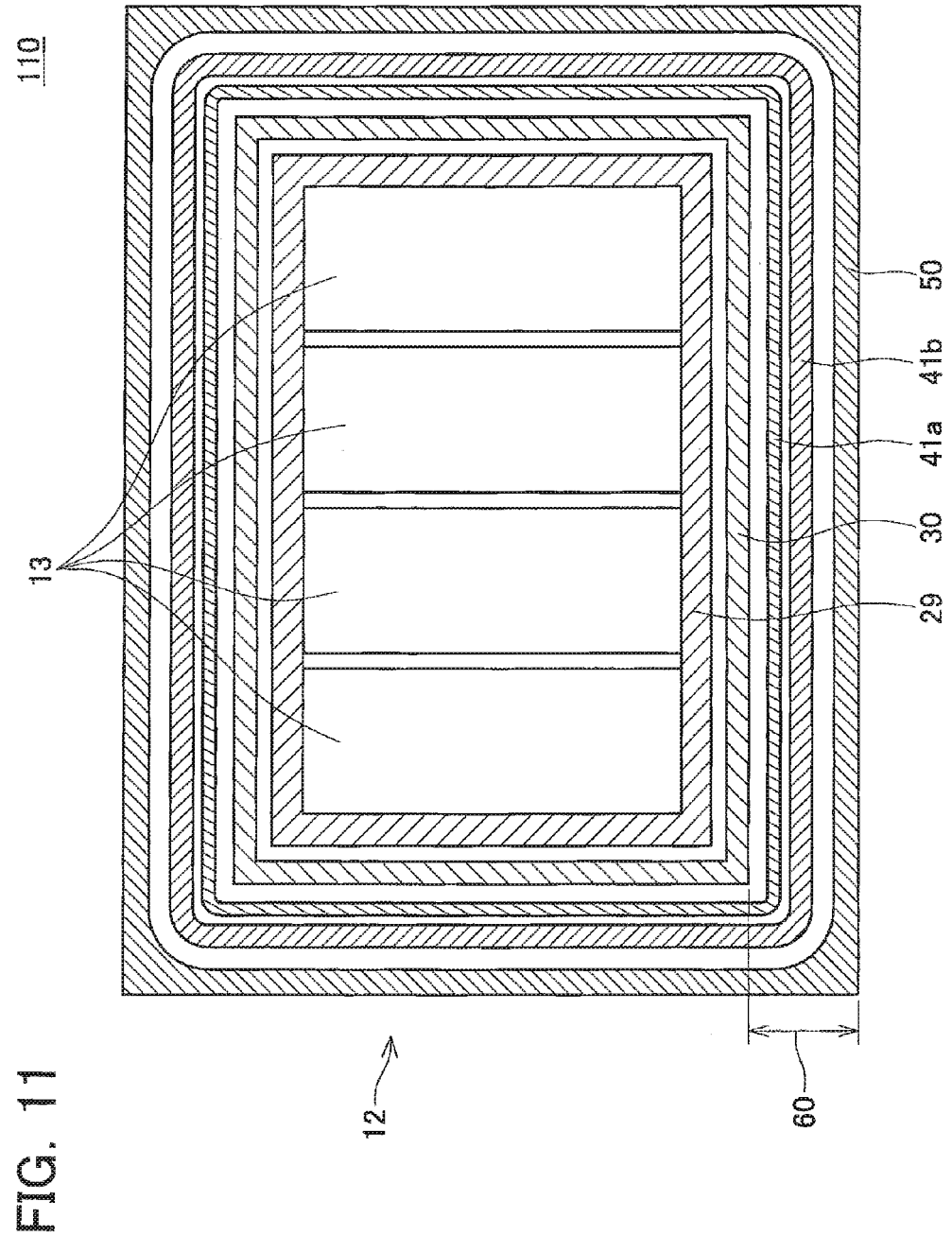
FIG. 11 shows a top view of the IGBT 110 of the second embodiment.

Next, an IGBT 110 of the second embodiment is described. Note that portions of the IGBT 110, which have the same function as the portions of the IGBT 10 of the first embodiment, are given the same reference numbers as the first embodiment. Furthermore, the IGBT 110 of the second embodiment is different only in the intermediate electrode from the IGBT 10 of the first embodiment. Therefore, the IGBT 110 of the second embodiment is described in relation to only the intermediate electrode. FIG. 10 shows an enlarged cross-sectional view of the peripheral termination region 60 of the IGBT 110 of the second embodiment. As shown in FIG. 10, in the IGBT 110 of the second embodiment, two intermediate electrodes 41a, 41b are formed within the interlayer dielectric film 17 within the peripheral termination region 60. FIG. 11 shows a top view of the semiconductor substrate 12 of the IGBT 110 of the second embodiment. As shown in FIG. 11, the intermediate electrode 41a surrounds the four semiconductor element regions 13. Furthermore, the intermediate electrode 41b surrounds the four semiconductor element regions 13 at the external side of the intermediate electrode 41a. As shown in FIG. 10, the width of the intermediate electrode 41a (i.e. the width in a direction from the semiconductor element region 13 to the circumference portion 12c) is smaller than the width of the intermediate electrode 41b. Also, the thickness of the interlayer dielectric film 17 under the intermediate electrode 41a is equal to the thickness of the interlayer dielectric film 17 under the intermediate electrode 41b.

Next, an electric field distribution within the peripheral termination region 60 in a case where the IGBT 110 is in the off state and the interlayer dielectric film 17 is in the charged state is described. With the IGBT 110 of the second embodiment, the electric potential of the peripheral electrode 50 is substantially equal to the electric potential of the collector electrode 33. Furthermore, the electric potentials of the intermediate electrodes 41a, 41b become values between the electric potential of the peripheral electrode 50 and the electric potential of the emitter electrode 32. Additionally, because the intermediate electrode 41b is in a position closer to the peripheral electrode 50 than the intermediate electrode 41a, the electric potential of the intermediate electrode 41b is higher than the electric potential of the intermediate electrode 41a. The curve lines 76 in FIG. 10 indicate the equipotential lines within the peripheral termination region 60 in a case where the IGBT 110 is in the off state and the interlayer dielectric film 17 is in the charged state.

The electric potential at the surface layer of the drift region 24 closer to the semiconductor element region 13 than the intermediate electrode 41a (i.e. the electric potential at the surface layer of the drift region 24 within the range 92 of FIG. 10) becomes substantially uniform due to the effect of the electrification of the interlayer dielectric film 17. Most of the equipotential lines are extended toward the side of the circumference portion 12c within the range 92. The electric potential at the surface layer of the drift region 24 below the intermediate electrode 41a (i.e. the electric potential at the surface layer of the drift region 24 within the range 94 of FIG. 10) is affected by the electric potential of the intermediate electrode 41a. Therefore, the electric potential at the surface layer of the drift region 24 within the range 94 becomes higher than the electric potential at the surface layer of the drift region 24 within the range 92. However, because the width of the intermediate electrode 41a is small, the effect applied to the electric potential of the drift region 24 below the intermediate electrode 41a by the intermediate electrode 41a is small. Therefore, the electric potential at the surface layer of the drill region 24 within the range 94 is higher than the electric potential at the surface layer of the drift region 24 within the range 92, but this potential difference is small. As a result, as shown in FIG. 10, a small number of the equipotential lines extend toward the upper surface 12a at the boundary of the range 92 and the range 94. In other words, because the ability of the intermediate electrode 41a to stop the equipotential lines is not so prominent because of the small width of the intermediate electrode 41a, the number of the equipotential lines stopped at the boundary of the range 92 and the range 94 (i.e. the equipotential lines extending toward the upper surface 12a) is small. Consequently, the electric field which occurs at the boundary of the range 92 and the range 94 is not so high. The electric potential at the surface layer of the drift region 24 between the intermediate electrode 41a and the intermediate electrode 41b (i.e. the electric potential at the surface layer of the drift region 24 within the range 96 of FIG. 10) becomes substantially uniform due to the effect of the electrification of the interlayer dielectric film 17. The electric potential at the surface layer of the drift region 24 within the range 96 becomes substantially equal to the electric potential at the surface layer of the drift region within the range 94. Therefore, most of the equipotential lines extend toward the side of the circumference portion 12c within the range 94 and the range 96. The electric potential at the surface layer of the drift region 24 below the intermediate electrode 41b (i.e. the electric potential at the surface layer of the drift region 24 within the range 98 of the FIG. 10) is affected by the electric potential of the intermediate electrode 41b. Therefore, the electric potential at the surface layer of the drift region 24 within the range 98 becomes higher than the electric potential at the surface layer of the drift region 24 within the range 96. Because the width of the intermediate electrode 41b is large, the effect applied to the electric potential of the drift region 24 below the intermediate electrode 41b by the intermediate electrode 41b is prominent. However, because the electric potential at the surface layer of the drift region 24 within the range 96 is increased by being affected by the intermediate electrode 41a, the difference in the electric potential which occurs at the boundary of the range 96 and the range 98 is small. Consequently, as shown in FIG. 10, a small number of the equipotential lines extend toward the upper surface 12a. The electric field which occurs at the boundary of the range 96 and the range 98 is not so large. The electric potential at the surface layer of the drift region 24 closer to the circumference portion 12c than the intermediate electrode 41b (i.e. the electric potential at the surface layer of the drift region within the range 100 of FIG. 10) becomes substantially uniform because of the electrification of the interlayer dielectric film 17. Therefore, the electric potential at the surface layer of the drift region 24 within the range 100 becomes substantially equal to the electric potential at the surface layer of the drift region 24 within the range 98. Most of the equipotential lines extend within the range 98 and the range 100 toward the side of the circumference portion 12c. The electric potential at the surface layer of the semiconductor substrate 12 under the peripheral electrode 50 (i.e. the electric potential at the surface layer of the semiconductor substrate 12 within the range 102 of FIG. 10) is substantially equal to the electric potential of the collector electrode 33. Therefore, the equipotential lines extend toward the upper surface 12a at the boundary of the range 100 and the range 102, and the relatively high electric field occurs at that boundary.

Figure 12:
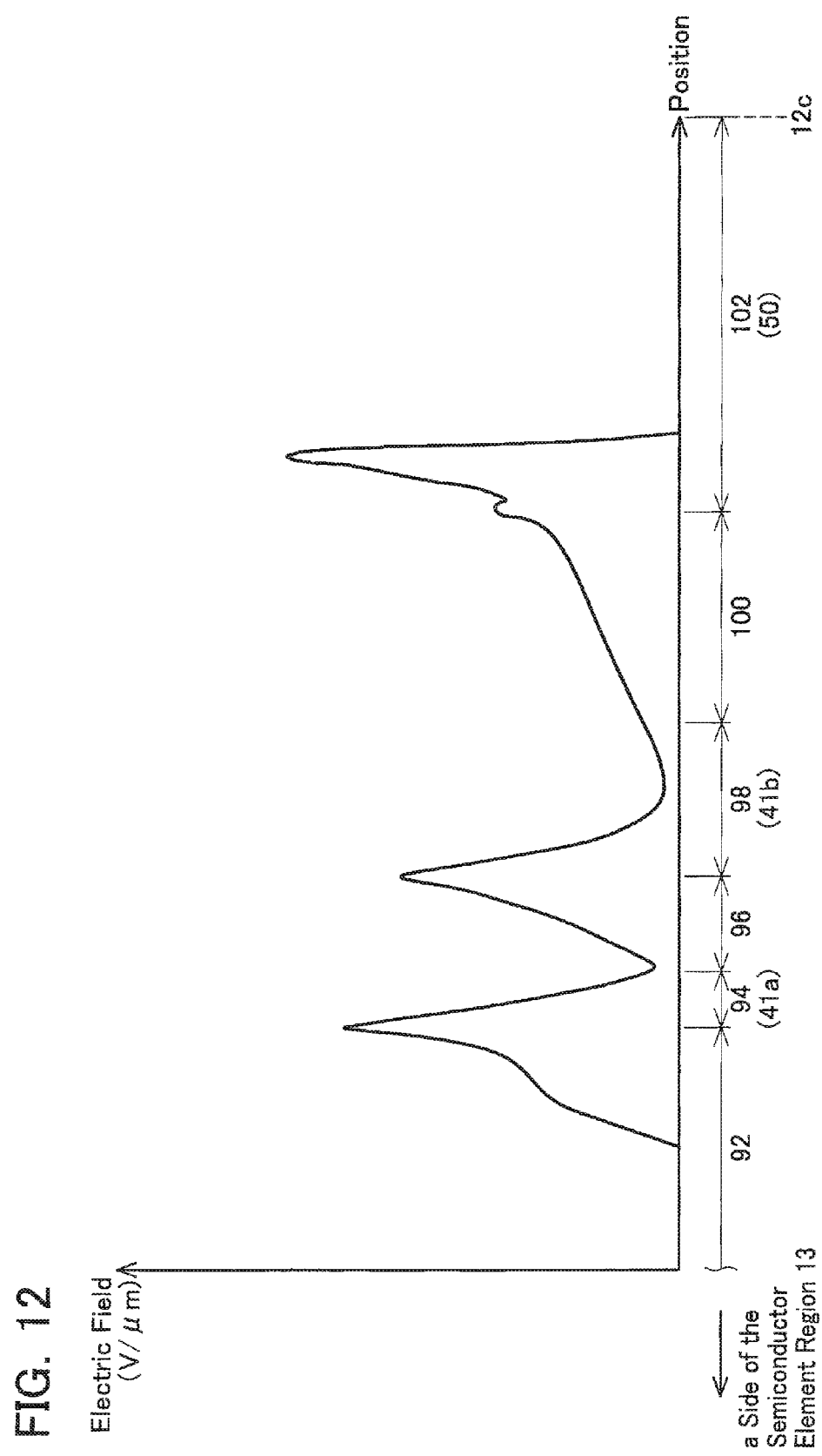
FIG. 12 is a graph showing an electric field distribution within an upper surface 12a layer of the peripheral termination region 60 of a semiconductor substrate 12 of the IGBT 110 of the second embodiment.

As described above, with the IGBT 110 of the second embodiment, the equipotential lines are stopped by the intermediate electrodes 41a, 41b and the peripheral electrode 50, so the equipotential lines are prevented from reaching the circumference portion 12c. That is, the depleted layer is prevented from reaching the circumference portion 12c. Also, the intermediate electrode 41a having small width and the intermediate electrode 41b having large width are formed on the peripheral termination region 60. Therefore, the electric field modulates moderately near the intermediate electrodes 41a, 41b, so the electric field concentration is prevented from occurring. Especially, the intermediate electrode 41a, at which the electric field concentration is inclined to occur easily due to being located closest to the semiconductor element region 13, has small width, so the number of the equipotential lines stopped by the intermediate electrode 41a becomes small. As a result, the electric field concentration near the intermediate electrode 41a is suppressed effectively. FIG. 12 is a graph showing an electric field distribution at the surface layer of a peripheral termination region 60 of the IGBT 110 of the second embodiment. As shown in FIG. 12, the electric field concentration near the intermediate electrodes 41a, 41b is suppressed, and, as a result, the electric field near the intermediate electrodes 41a, 41b becomes smaller than the electric field near the peripheral electrode 50. The IGBT 110 of the second embodiment has higher electric strength than the conventional IGBT.

As described above, with the IGBT 110 of the second embodiment, the width of the intermediate electrode 41a which is closest to the semiconductor element region 13 is smaller than the width of the intermediate electrode 41b which is adjacent to the intermediate electrode 41a. Therefore, the equipotential lines within the drift region 24 can be stopped (i.e. the depleted layer can be eliminated) while the equipotential lines within the drift region 24 modulate moderately. That is, the depleted layer can be terminated while suppressing the electric field concentration.

Figure 13:
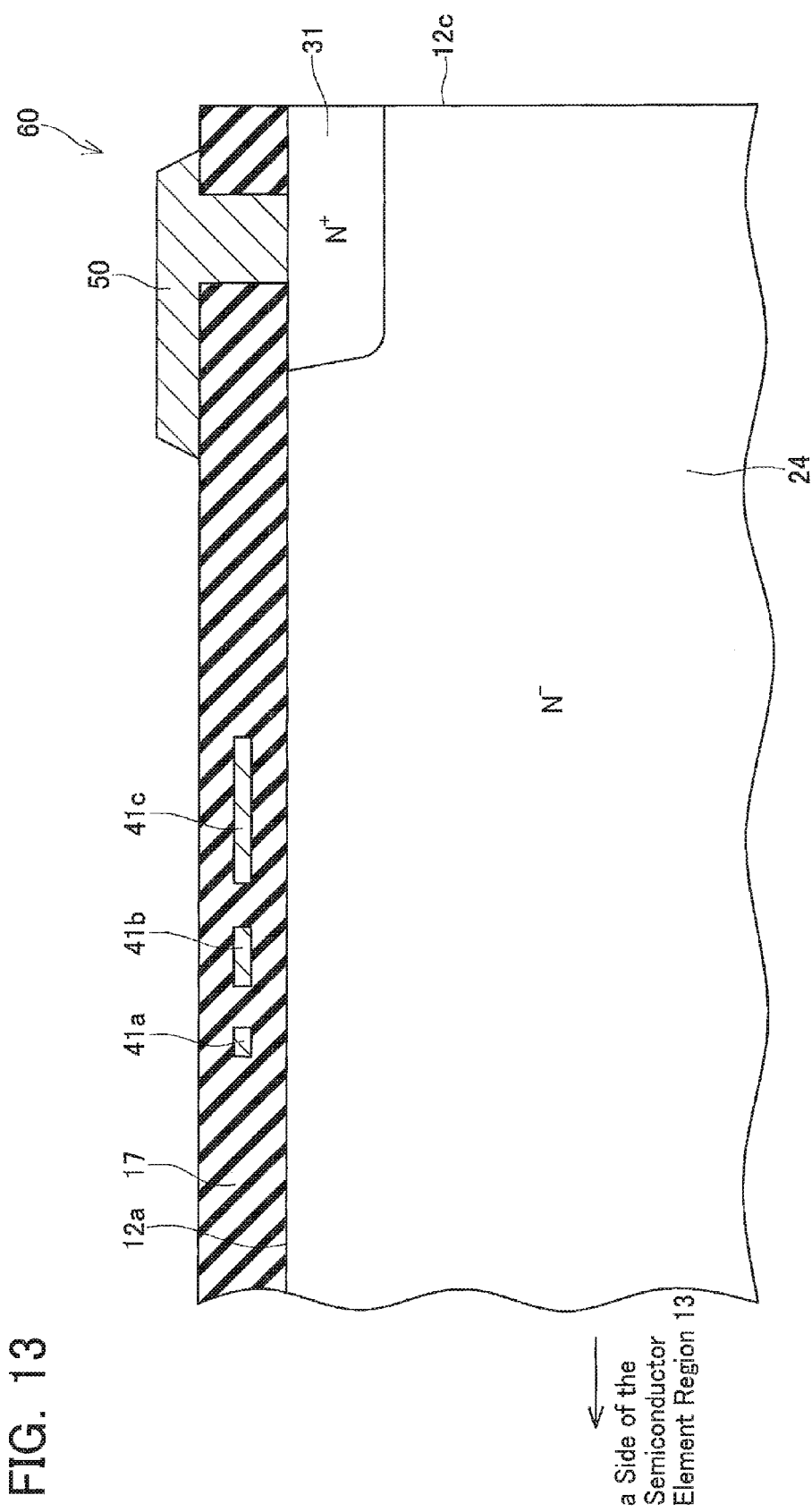
FIG. 13 shows an enlarged cross-sectional view of a peripheral termination region 60 of an IGBT of the fourth variant embodiment.
Figure 14:
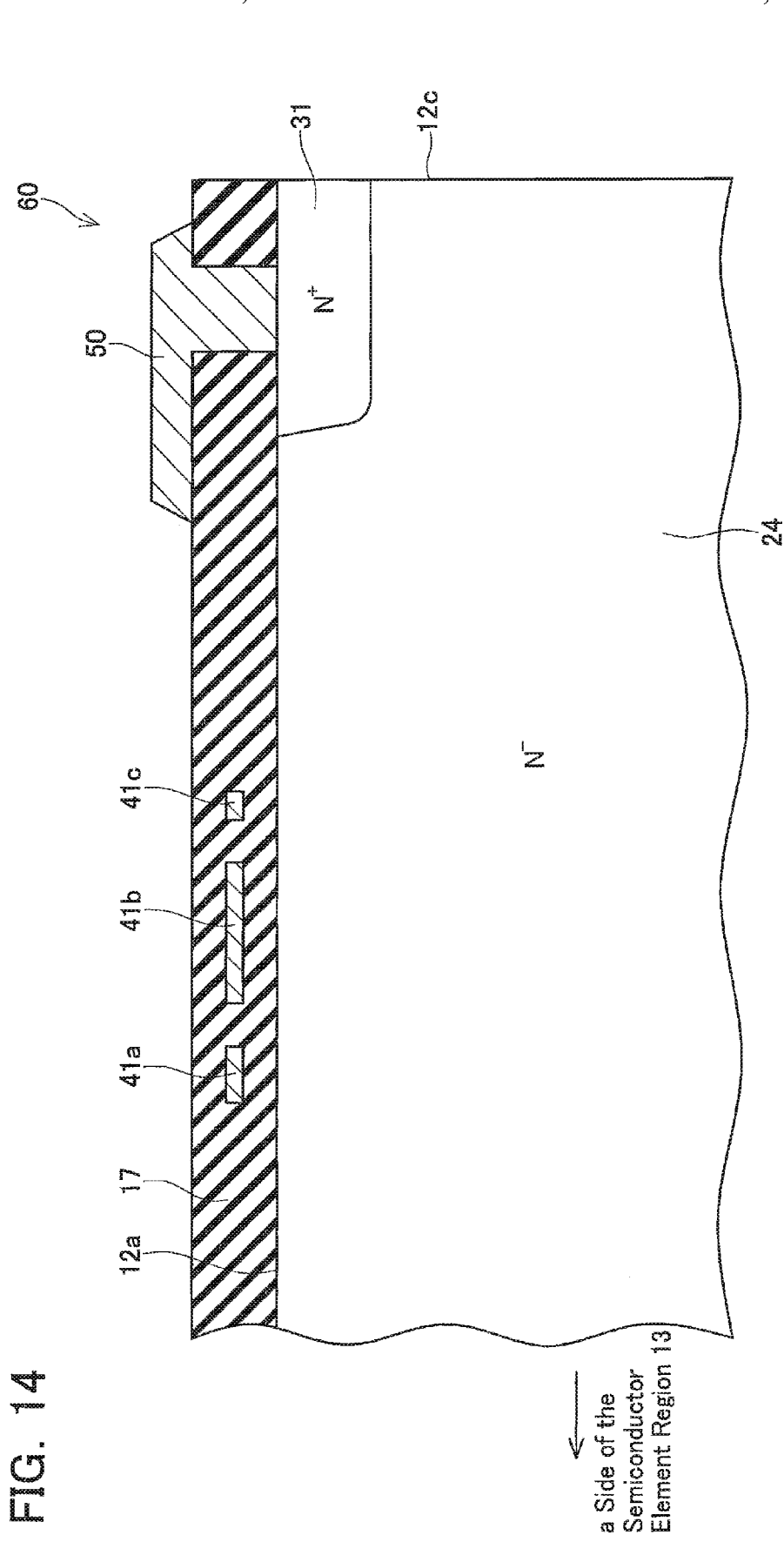
FIG. 14 shows an enlarged cross-sectional view of a peripheral termination region 60 of an IGBT of the fifth variant embodiment.
Figure 15:
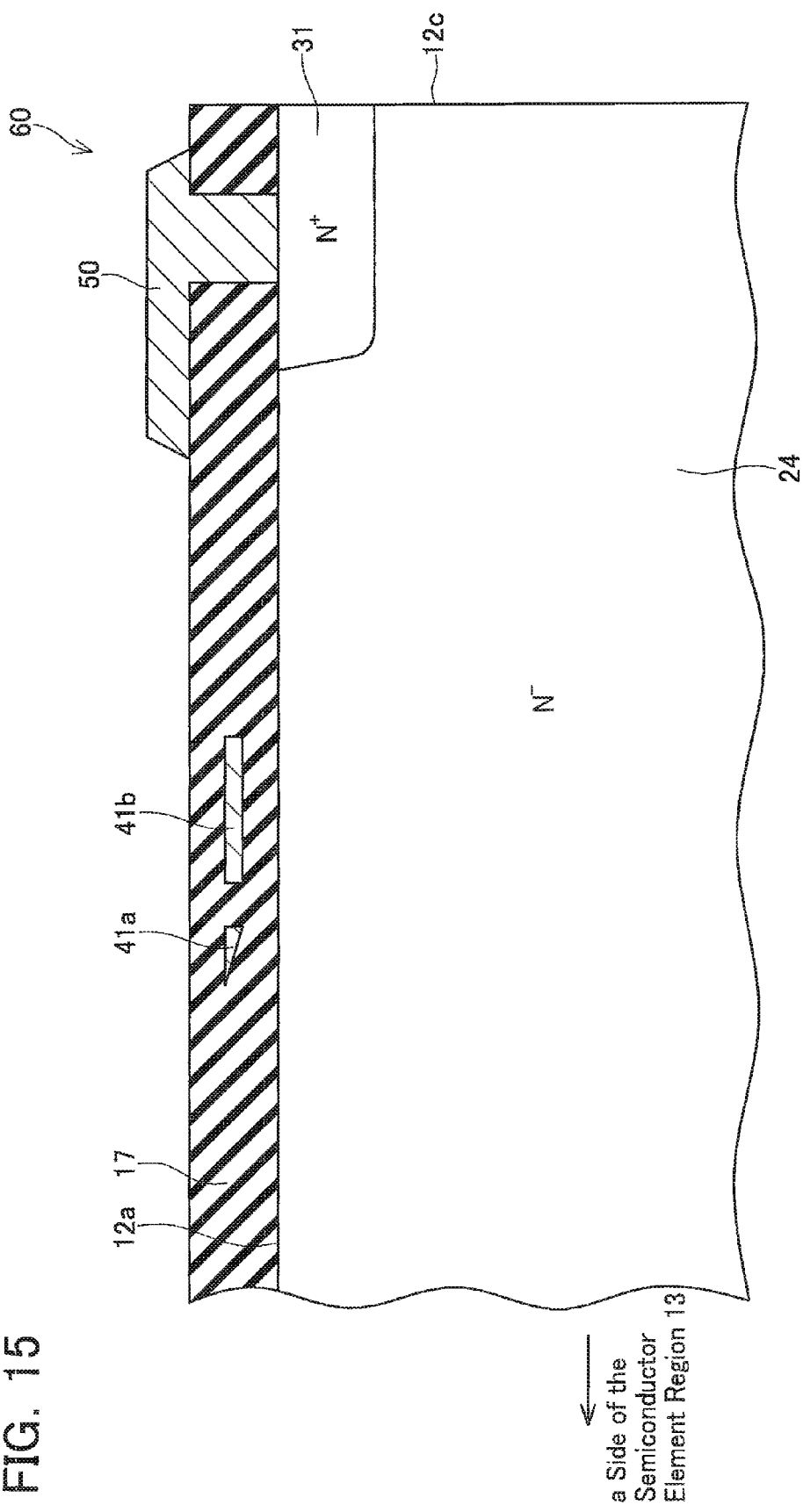
FIG. 15 shows an enlarged cross-sectional view of a peripheral termination region 60 of an IGBT of the sixth variant embodiment.
Figure 16:
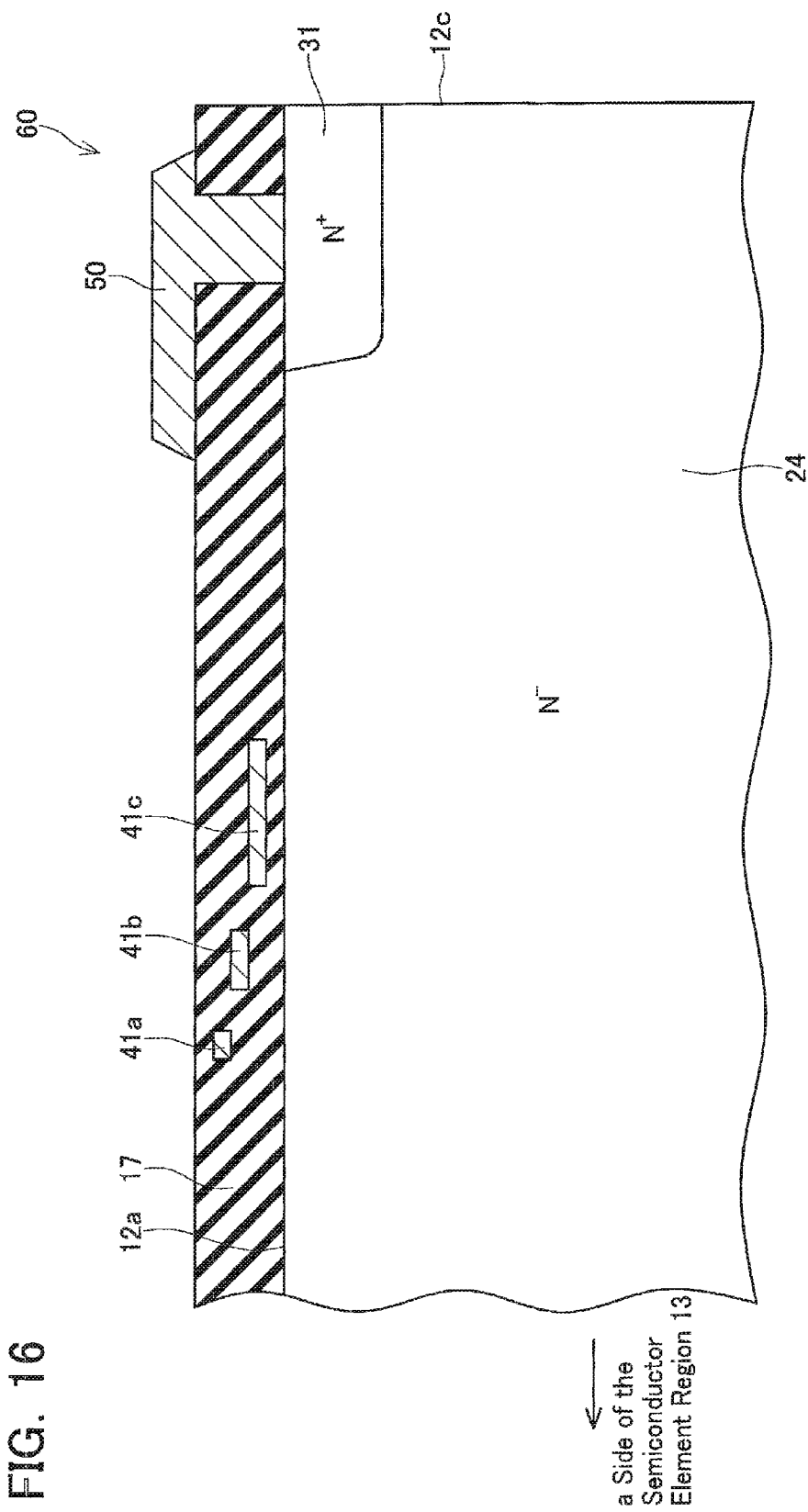
FIG. 16 shows an enlarged cross-sectional view of a peripheral termination region 60 of an IGBT of the seventh variant embodiment.

Note that the two intermediate electrodes 41a, 41b are formed in the IGBT 110 of the second embodiment, but alternately, three intermediate electrodes 41a-41c may be formed as shown in FIG. 13. Furthermore, more than three intermediate electrodes may alternately be formed. In a case where more than two intermediate electrodes are formed, at least the relationship that the width of the intermediate electrode 41a, which is closest to the semiconductor element region 13, is smaller than the width of the intermediate electrode 41b, which is adjacent to the intermediate electrode 41a, should be satisfied, but the widths of the other intermediate electrodes can be decided freely. For example, as shown in FIG. 14, the width of the intermediate electrode 41c Which is closest to the circumference portion 12c can be the smallest. Also, as shown in FIG. 15 and FIG. 16, the thickness of the interlayer dielectric film 17 under the intermediate electrode can be varied. Furthermore, the intermediate electrodes can be formed of common material or different materials from each other.

The technical elements disclosed in the specification or the drawings may be utilized separately or in all types of combinations, and are not limited to the combinations set forth in the claims at the time of filing of the application. Furthermore, the subject matter disclosed herein may be utilized to simultaneously achieve a plurality of objects or to only achieve one object.

The invention claimed is:

1. A semiconductor device, comprising:
a semiconductor element region exposed at one surface of a semiconductor substrate, a semiconductor element is formed within the semiconductor element region;
a peripheral termination region exposed at the one surface of the semiconductor substrate, formed around the semiconductor element region, and formed of a single conductive type semiconductor;
a peripheral electrode formed on a surface of the peripheral termination region and along a circumference of the semiconductor substrate, and electrically connected with the peripheral termination region;
an insulating film formed on the surface of the peripheral termination region and between the peripheral electrode and the semiconductor element region;
a plurality of intermediate electrodes formed on the insulating film and disposed at an interval along a direction from the semiconductor element region to the peripheral electrode,
wherein a width of a first intermediate electrode in the direction, the first intermediate electrode being one of the intermediate electrodes closest to the semiconductor element region, is smaller than a width of a second intermediate electrode in the direction, the second intermediate electrode being one of the intermediate electrodes adjacent to the first intermediate electrode, and
wherein a thickness of the insulating film under at least one intermediate electrode is smaller at a side of the peripheral electrode than at a side of the semiconductor element region.

2. The semiconductor device as in claim 1, wherein each of the intermediate electrodes surrounds the semiconductor element region.

3. The semiconductor device as in claim 1, wherein each of the intermediate electrodes is insulated from the semiconductor element region, the peripheral electrode and each other.

4. The semiconductor device as in claim 1, wherein a width of each intermediate electrode in the direction is configured such that the width of the intermediate electrode on the side of the peripheral electrode is larger than the width of the intermediate electrode on the side of the semiconductor element region.

* * * * *